(12) United States Patent
Bimberg et al.

(10) Patent No.: US 7,580,595 B1
(45) Date of Patent: Aug. 25, 2009

(54) DATA TRANSMISSION OPTOELECTRIC DEVICE

(75) Inventors: Dieter Bimberg, Berlin (DE); Nikolai N. Ledentsov, Berlin (DE); Vitaly Shchukin, Berlin (DE)

(73) Assignee: Technische Universitaet Berlin, Berlin (DE)

(*) Notice: Subject to any disclaimer, the term of this patent is extended or adjusted under 35 U.S.C. 154(b) by 0 days.

(21) Appl. No.: 12/118,327

(22) Filed: May 9, 2008

(51) Int. Cl.
*G02F 1/295* (2006.01)
*G02B 6/10* (2006.01)

(52) U.S. Cl. .............................. 385/4; 385/8; 385/132

(58) Field of Classification Search ............... 385/5, 385/8, 132
See application file for complete search history.

(56) References Cited

U.S. PATENT DOCUMENTS

| | | | |
|---|---|---|---|
| 5,675,603 A * | 10/1997 | Jenkins | 372/64 |
| 6,285,704 B1 | 9/2001 | Kullander-Sjoberg et al. | |
| 6,396,083 B1 | 5/2002 | Ortiz et al. | |
| 6,611,539 B2 | 8/2003 | Ledentsov et al. | |
| 6,661,816 B2 | 12/2003 | Delfyett et al. | |
| 6,862,312 B2 | 3/2005 | Fafard | |
| 7,031,360 B2 | 4/2006 | Ledentsov et al. | |
| 7,075,954 B2 | 7/2006 | Ledentsov et al. | |
| 2002/0006141 A1 | 1/2002 | Ogura | |
| 2004/0144971 A1 | 7/2004 | Stegmuller | |
| 2005/0216800 A1 | 9/2005 | Bickenell et al. | |
| 2007/0009323 A1 | 1/2007 | Jones et al. | |
| 2007/0291805 A1 | 12/2007 | Ledentsov et al. | |

FOREIGN PATENT DOCUMENTS

| | | |
|---|---|---|
| DE | 10260378 A1 | 7/2004 |
| EP | 1174966 A2 | 1/2002 |
| EP | 1317035 A1 | 6/2003 |
| WO | 02097934 A2 | 12/2002 |
| WO | 2008041138 A2 | 4/2008 |

OTHER PUBLICATIONS

Weber et al. "High-frequency response of p-substrate buried crescent InGaAsP lasers" J. Appl. Phys., vol. 68, No. 5, Sep. 1, 1990 pp. 2499-2500.
Tauber et al., "70 GHz relaxation oscillation in vertical cavity surface emitting laser," IEEE Trans. Electron. Devices, vol. 39, No. II p. 2652, Nov. 1992.

(Continued)

*Primary Examiner*—Frank G Font
*Assistant Examiner*—Eric Wong
(74) *Attorney, Agent, or Firm*—Laurence A. Greenberg; Werner H. Stemer; Ralph E. Locher

(57) ABSTRACT

An optoelectronic data transmission device has an active section with an active element that generates an optical gain if a forward bias is applied, and an absorption section. A waveguide incorporates the active section and the absorption section. Mirrors providing feedback for light are placed to frame the waveguide. The device can be operated in a pulsed regime emitting pulsed laser light. An additional modulator allows modulating its refractive index due to the electrooptic effect. A device providing for the modulation of the refractive index of the modulator. The refractive index of the additional modulator can be varied such that the repetition frequency of the output pulsed laser light is varied. The waveguide further incorporates the additional modulator.

11 Claims, 10 Drawing Sheets

OTHER PUBLICATIONS

Tauber et al., "70 GHz relaxation oscillation in a vertical cavity surface emitting laser" Device Research Conference, 1992. Digest. 50th Annual, Jun. 22-24, 1992 pp. 0_81-0_82.

Kim et al., "High-Frequency Modulation Characteristics of 1.3-m InGaAs Quantum Dot Lasers" IEEE Photonics Technology Letter, vol. 16, No. 2, Feb. 2004 pp. 377-379.

Weisser et al, "Damping-limited modulation bandwidths up to 40 GHz in undoped short-cavity In0.35Ga0.65As-GaAs multiple-quantum-well lasers" IEEE Photonics Technology Letter, Vo. 8, No. 5 May 1996 pp. 608-610.

Yoshie et al., "Photonic crystal defect microcavities with indium arsenide quantum dots" Lasers and Electro-Optics Society 2000 Annual Meeting. LEOS 2000. 13th Annual Meeting. IEEE ,vol. 2, Nov. 13-16, 2000 pp. 415-416 vol. 2.

Ledentsov et al., "Interconnection between gain spectrum and cavity mode in a quantum dot vertical cavity laser" Semicond. Sci. Technol. 14, pp. 99-102 (1999).

Proceedings of SPIE (vol. 3632, Optoelectronic Interconnects VI, Julian P. G. Bristow, Suning Tang, Editors, Apr. 1999 (Abstract).

Al-Omari et al., "Polyimide-planarized vertical-cavity surface-emitting lasers with 17.0-GHz bandwidth" IEEE Photonics Technology Letter, vol. 16, No. 4, Apr. 2004 pp. 969-971.

Pepeljugoski et al., "15.6-Gb/s transmission over 1 km of next generation multimode fiber", IEEE Photonics Technology Letter, vol. 14, No. 5, May 2002 pp. 717-719.

Kuchta et al., "VCSEL modulation at 20 Gb/s over 200 m of multimode fiber using a 3.3 V SiGe laser driver IC" Advanced Semiconductor Lasers and Applicants/Ultraviolet and Blue Lasers and Their Applications/Ultralong Haul DWDM Transmission and Networking/WDM Components, 2001 Digest of the LEOS Summer Topical Meetings, Jul. 30-Aug. 1, 2001 pp. 2.

Won-Jin Choi et al., "Low insertion loss and low dispersion penalty InGaAsP quantum-well high-speed electroabsorption modulator for 40-Gb/s very-short-reach, long-reach, and long-haul applications" Journal of Lightwave Technology, vol. 20, Issue 12 pp. 2052-2056 (2002).(Abstract).

Mineo et al., "60-GHz band electroabsorption modulator module," in Proc. OFC 1998, 1998, ThH4.

Devaux et al., "Experimental optimization of MQW electroabsorption modulators with up to 40GHz bandwidths," Electronics Letters, vol. 30, No. 16, Aug. 4, 1994 pp. 1347-1348.

Steinbach et al., "Equivalent circuit modelling of p-i-n photodiodes for 40 Gb/s receivers" Lasers and Electro-Optics Society, 2002. LEOS 2002. The 15th Annual Meeting of the IEEE, vol. 2, Nov. 10-14, 2002, pp. 486-487 vol. 2.

Alekseev et al., "77 GHz high-isolation coplanar transmit-receive switch using InGaAs/InP PIN diodes" Gallium Arsenide Integrated Circuit (GaAs IC) Symposium, 1998. Technical Digest 1998., 20th Annual Meeting, Nov. 1-4, 1998. pp. 177-180.

Muramoto et al., "InP/InGaAs pin photodiode structure maximising bandwidth and efficiency" Electronics Letters, vol. 39, No. 24, Nov. 27, 2003, pp. 1749-1750.

Umbach et al., "Technology of InP-based 1.55-μm ultrafast OEM-MICs: 40-Gbit/s broad-band and 38/60-GHz narrow-band photoreceivers" IEEE Journal Quantum Electronics, vol. 35, No. 7, Jul. 1999, pp. 1024-1031.u.

Feng et al., "Field-induced optical effect in a five-step asymmetric coupled quantum well with modified potential," IEEE Journal Quantum Electronics, vol. 34, No. 7, Jul. 1998 pp. 1197-1208.

Earnshow et al., "Electrooptic Effects in GaAS-AlGaAs Narrow Coupled Quantum Wells", IEEE Journal of Quantum Electronics, vol. 37 (7), pp. 897-904; ibid. vol. 37 (8), p. 1103 (2001).

Koltyar et al., "Electrooptic tuning of InP-based microphotonic Fabry-Pérot filters", Journal Lightwave Technology, vol. 23, pp. 2169-2174 (2005). (Abstract).

Ledentsov et al., "Merging Nanoepitaxy and Nanophotonics". In: "Future Trends in Microelectronics: Up the Nano Creek", ed. by. S. Luryi, J. Xu, and A. Zaslavsky, Wiley & Sons, New York (2006).

Galbraith et al., "Empirical determination of the electroabsorption coefficient in semiconductors", J. Appl. Phys., vol. 74, No. 6, pp. 4145-4148 (1993).

Chelma et al., "Room Temperature Excitonic Nonlinear Absorption and Refraction in GaAs/AlGaAs Multiple Quantum Well Structures", IEEE Journal of Quantum Electronics, vol. QE-20 (3), pp. 265-275 (1984).

Zucker et al., "Electro-optic phase modulation in GaAs/AlGaAs quantum well waveguides", Applied Physics Letters, vol. 52 (12), pp. 945-947 (1988).

Weiner et al., "Quadratic electro-optic effect due to the quantum-confined Stark effect in quantum wells", Applied Physics Letters, vol. 50 (13), pp. 842-844 (1987).

Zucker et al., "Quaternary quantum wells for electro-optic intensity and phase modulation at 1.3 and 1.55 mm", Applied Physics Letters, vol. 54 (1), pp. 10-12 (1989).

Chen et al., "Optical Absorption and Modulation Behavior of Strained InxGa1-xAs/GaAs (100)( ) multiple quantum well structure grown via molecular beam epitaxy", Applied Physics Letters, vol. 57 (23), pp. 2478-2480 (1990).

Confined quantum Stark effect, Physical Review B, vol. 48 (3), pp. 1963-1966 (1993).

Wasserbauer et al.: "Integrated Optical Transmitters And Receivers Using Multi-segment Laser Processes", Optical Fiber Conference OFC, Jul. 29, 1992.

Ledentsov et al: "Novel concepts for injection lasers", Optical engineering, soc. Of photo-optical instrumentation engineers. Bellingham, US, vol. 41, No. 12, Dec. 2002, pp. 3193, XP002274010, ISSN: 0091-3286.

Siepmann, James. Light Time LLC, Oshkosh, Wis. "Modelocked Semiconductor Lasers for High-Speed Microprocessor Clocking"; Semiconductor International, Mar. 1, 2006.

Shinji Yamashita et al: Wide and fast wavelength-tunable mode-locked fiber laser based on dispersion tuning; Optics Express 9299, vol. 14, No. 20, Oct. 2, 2006.

Kroh, Marcel; Semiconductor Mode-Locked Laser for High-Speed OTDM Transmission, Dissertation Jan. 25, 2006.

* cited by examiner

DATA TRANSMISSION OPTOELECTRIC DEVICE

BACKGROUND OF THE INVENTION

Field of the Invention

The invention pertains to the field of semiconductor devices. More particularly, the invention pertains to mode-locked lasers.

High-speed optoelectronic devices are broadly applied in modern data communication and telecommunication systems. There is a need in data transmission systems operating at ultrahigh speeds above 10-100 Gb/s.

The existing devices can be separated into two categories: those directly modulated by injection of current into the gain region, and those externally modulated. Direct-modulation offers the advantage of low cost but requires very high photon densities in the resonant cavity. For, example, edge-emitting lasers operating at 40 Gb/s have been reported.

The intrinsic speed is defined by the so-called "−3 dB" bandwidth, which is roughly proportional to the relaxation-oscillation frequency:

$$f_r = \frac{1}{2\pi}\sqrt{\frac{g_n p_0}{\tau_p}}, \quad (1)$$

where $g_n$ denotes the differential gain, $p_0$ is the average photon density in the cavity, and $\tau_p$ is the cavity photon lifetime.

A first way to increase the laser bandwidth is to increase the pump current density thereby increasing the photon population of the cavity, for example, by reducing the surface area of the device for the same total current. Under pulsed excitation relaxation, an oscillation frequency as high as 70 GHz has been demonstrated in a pulsed regime at room temperature under applied voltage of 15 volts. Continuous wave (CW) operation at very high current and dissipated power densities was not possible. Commonly accepted limitations for all types of semiconductor laser diodes are at ~0.2 mW/µm² of thermal power per surface area for heat dissipation. The limiting optical power is close to ~1 mW/µm². Maximum current densities assuming 30% wall-plug efficiency are about ~2 mA/µm² or 20 kA/cm².

A second way to increase the laser bandwidth is to increase the differential gain by lowering the dimensionality of the active layer. Modification of the density of states provides two key advantages. First, differential efficiency and threshold current can be made temperature stable in a wide temperature range.

More importantly, converting from quantum wells (QWs) to quantum dots (QDs) enables edge emitting lasers to reach 10 Gb/s operation at current densities of ~1 kA/cm², where conventional InP QW devices of this spectral range just start to lase. As the bandwidth increases approximately as a square root of current density. At the current density ~20 kA/cm² QD laser has a potential to reach 40 Gbps direct modulation if parasitic temperature-related effects and gain saturation effects are avoided. A QW device approaches the same frequency at about 3-4 times higher current densities.

Doping the cavity simplifies carrier trapping into the active media and reduces radiative lifetime and may increase differential gain.

Shifting the lasing photon energy beyond the band edge of the semiconductor to the gain continuum is possible for distributed feedback (DFB) lasers and vertical cavity surface-emitting lasers (VCSELs). In VCSELs this approach is particularly attractive, enabling device operation in the range of high gain, while avoiding gain saturation effects within the low-gain tail states.

Another very powerful but less exploited approach addresses optical mode engineering in the VCSEL cavity. Many disadvantages of laser diodes originate from parasitic radiative modes, which cause enhanced radiative leakage, thus preventing quickly approaching a population inversion. The same modes cause effective depletion of the vertical cavity gain below threshold, once the device reaches the population inversion condition. These parasitic processes are most pronounced in the solutions aimed at high-speed operation; in p-doped active media and in cavities with the cavity dip shifted into the gain continuum, where parasitic radiative recombination and gain leakage are particularly strong.

To prevent this effect, a photonic crystal-confined VCSEL may be used. In this case, radiative and gain leakage are partly prohibited by lack of photon states in the photonic crystal surrounding the cavity. Thus parasitic radiative recombination and gain are prohibited. This approach enables practically thresholdless lasers. Once the stimulated emission is channeled in a single mode, much higher gain is possible.

A disadvantage of this approach is its much higher cost and precise processing tolerances, related, for example, to deep ion etching of the distributed Bragg reflector (DBR) layers. The effect of suppressed parasitic leakage may also be achieved by choosing a specific VCSEL design.

None of the approaches for high-speed operation in the prior art address problems of parasitic capacitance, inductance and resistance in VCSELs.

In spite of the fact that low threshold QW and QD devices are realized, parasitic capacitance, inductance and resistance in VCSELs limit their high-speed performance, even when intrinsic parameters (relaxation oscillations) indicate the possibility for a much faster bit rate.

It is difficult to reduce parasitics in VCSELs and still provide certain aperture sizes, certain thicknesses of the Bragg reflector regions, certain surface areas of the current pads and unavoidable high differential capacitance of the p-n junction under direct bias. Approaching simultaneously a low threshold current, high frequency response, low power dissipation and high reliability represents a difficult problem for directly-modulated VCSELs.

The problem is usually addressed with careful optimization of the processing technology. The best bandwidth achieved in the prior art so far (17.0 GHz) was realized in a device operating at 4.5 mA with a 7 µm aperture (~12 kA/cm²). Dissipated power was 8.1 mW.

Faster intrinsic modulation responses of the device (larger bandwidths at the same current density) add more flexibility to achieve necessary compromises to reduce the parasitic effects that hinder time response. Modulation bandwidth of 40 GHz has been demonstrated in GaAs-based edge-emitting lasers and no fundamental limitations for VCSELs exist. High-speed VCSELs are used in high-bit rate long-distance LAN networks based on multimode fibers. However, a principal limitation is that the device must be operated at high current densities to achieve high modulation speed. 40 Gb/s VCSELs have not yet been demonstrated.

In contrast, indirect modulation using electrooptic effects under reverse bias has long been known in ultrahigh-speed transmitters operating at 40-60 Gb/s. For example, a 40-Gb/s open eye diagram of the electroabsorption modulator after 700-km transmission has been demonstrated.

Once the need for direct modulation is abandoned, ultra-high-speed signal management becomes much easier. 60-100 GHz pin diode photodetectors using large mesa devices as well as other devices are known in the art.

U.S. Pat. No. 6,285,704, entitled "Field modulated vertical cavity surface-emitting laser with internal optical pumping", issued Sep. 4, 2001, proposes a photopumped VCSEL. This VCSEL may be modulated by using an external electrical field applied perpendicular to the active layer, employing the Stark-effect to deliberately change the bandgap of the active layer and hence move the emission wavelength into and out of resonance with the optical cavity formed between the top and bottom mirrors. The optical output is therefore modulated by the electrical field and not by injected carriers. However, as the active region of the device is under a continuous population inversion condition, applying a reverse bias to change the bandgap may cause dramatic photocurrent, depleting the photopumped active region.

U.S. Pat. No. 6,396,083, entitled "Optical semiconductor device with resonant cavity tunable wavelength, application to modulation of light intensity", issued May 28, 2002, discloses a device including a resonant cavity. The resonant cavity is delimited by two mirrors and at least one superlattice that is placed in the cavity and is formed from piezoelectric semiconducting layers. The device also includes means of injecting charge carriers into the super-lattice. One disadvantage of this device is the necessity of using piezoelectric materials. The piezoelectric semiconducting layers are epitaxied on a $Cd_{0.88}Zn_{0.12}Te$ substrate and include a pattern composed of a layer of $Cd0.91Mg0.09Te$ and a layer $Cd_{0.88}Zn_{0.22}Te$, each 10 nm thick. This pattern is repeated about a hundred times. The device in this patent is a two-terminal device. The separation of carriers in a piezoelectric superlattice causes long depopulation times. Wavelength modulation and intensity modulation are always interconnected in this patent.

An electrooptic modulator based on the quantum confined Stark effect (QCSE) in a VCSEL was disclosed in U.S. Pat. No. 6,611,539, entitled "Wavelength-Tunable Vertical Cavity Surface Emitting Laser and Method of Making Same" issued Aug. 26, 2003, by the inventors of the present invention and herein incorporated by reference. The device includes active media suitable for providing gain and enabling laser action of the device, and a position-dependent electrooptic modulator region. Applying the voltage to the modulator region results in a wavelength shift of the lasing wavelength. The absorption in the modulator region remains small. The device is especially applicable for ultrahigh-speed data transfer using wavelength-modulation.

U.S. Pat. No. 7,075,954, entitled "Intelligent wavelength division multiplexing systems based on arrays of wavelength tunable lasers and wavelength tunable resonant photodetectors", by the inventors of the present invention and herein incorporated by reference, disclosed high-bit rate data transfer systems based on wavelength-to-intensity modulation conversion. In this approach, a wavelength-tunable VCSEL operates in concert with a wavelength-selective photodetector on the receiver side. Modulation of the VCSEL wavelength transforms into the photodetector current modulation.

Our copening U.S. patent application Ser. No. 11/144,182, entitled "Electrooptically wavelength-tunable resonant cavity optoelectronic device for high-speed data transfer", describes a monolithically integrated device, based on two coupled cavity. The device operates as a VCSEL, wherein the first cavity is an active cavity, into which an active medium is placed. The second cavity is a modulator cavity, into which a modulator is placed. A reverse bias is applied to the modulator allowing change of the refractive index of the second cavity due to the Quantum Confined Stark Effect. By applying a bias to the modulator the modulator cavity can be set on or off resonance with the active cavity. If the two cavities are in resonance, the emitted laser light comes out of the device. Off resonance, the emitted laser light does not come out of the device. Applying a high-frequency signal to the modulator cavity allows a high-frequency modulation of the intensity of the emitted laser light.

German patent application DE 102 60 378 discloses a data transmission optoelectronic device designed to generate especially short light pulses with a high repetition rate. Two active layers, or two stacks of active layers are used wherein a first active layer (a first stack) is optimized with respect to the active section of the device, and a second active layer (a second stack) is optimized with respect to the absorption section of the device. An independent optimization of two active layers (or two active layer stacks) allows to obtain the active medium with better quality. Such improvement can result in a mode-locked laser generating shorter pulses with a higher repetition rate than conventional mode-locked lasers.

Conventional directly modulated lasers, most commonly used as fiberoptic signal transmitters in datacom applications meet severe difficulties, when operated at frequencies above 10 Gb/s. As opposite, indirectly-modulated devices, based, for example, on electroabsorption effect, suffer from high cost, complexity and power consumption.

SUMMARY OF THE INVENTION

It is an object of the present invention to provide a method for transmitting data and to provide a data transmission optoelectronic device which offers further functionality and allows for data transmission with a larger data rate than those devices as described above.

With the above and other objects in view there is provided, in accordance with the invention, data transmission optoelectronic device, comprising:

a waveguide disposed between mirrors providing feedback for light;

an active section incorporated in the waveguide, the active section having an active element for generating an optical gain if a forward bias is applied;

an absorption section incorporated in the waveguide; and an additional modulator incorporated in the waveguide, the additional modulator being configured to modulate a refractive index thereof such that a repetition frequency of the pulsed laser light is frequency-modulated and frequency-modulated optical data signals are generated;

wherein the device is operable in a pulsed regime emitting pulsed laser light and the device is adapted to transmit frequency-modulated data signals.

In other words, the optoelectronic data transmission device according to the invention comprises at least one active section, at least one absorber section, and at least one electrooptic modulator. The active section contains an active element generating optical gain when a forward bias is applied. The absorbing section contains a saturable absorber, preferably operating under a zero or reverse bias, such that the device operates in a self-pulsating mode-locked regime generating pulsed laser light. The electrooptic modulator may change its refractive index due to the electrooptic effect such that the repetition frequency of the output pulsed laser light is varied. Accordingly, the inventive optoelectronic device provides further functionality as for instance data signals may be transmitted in a frequency modulated manner (analog or digital) at a very high bit rate.

Preferably the additional modulator comprises a material that exhibits an electrooptic effect providing a relative change of the refractive index of at least Δn[%]=1% at an applied electric field 100 keV/cm. These values refer to a change of the material refractive index. The impact of this change on the functionality of a device is governed by a change of the modal refractive index. The two values are related approximately as follows, $$\Delta n_{modal} = \Gamma \times \Delta n_{material}, \quad (2)$$

where Γ is the optical confinement factor of the optical mode in the material exhibiting an electrooptic effect.

In a preferred embodiment, the electrooptic modulator contains a stack of quantum wells, wires, or dots, operates under a reverse bias, the refractive index being varied due to Quantum Confined Stark Effect. The change of the refractive index of the modulator results in a change of the effective group velocity of the light within the device, and thus, in a change of the repetition frequency. The device may be used for data transfer by using frequency modulation. The change in frequency may be detected by a frequency-sensitive detecting system. The device can be based on an edge-emitting laser, a vertical cavity surface emitting laser, a tilted cavity laser, a distributed feedback laser, a wavelength-stabilized leaky wave laser with the reflection from the back side of the substrate.

In accordance with an added feature of the invention, the additional modulator comprises a material that exhibits an electrooptic effect providing a relative change of the refractive index of at least Δn[%]=1% at an applied electric field 100 keV/cm.

In accordance with an additional feature of the invention, the means for providing modulation includes a switch for switching the repetition frequency between at least two different repetition frequencies.

In accordance with another feature of the invention, the active section may be an edge-emitting diode laser; a vertical cavity surface emitting laser; a tilted cavity laser operating in the edge-emitting geometry; a tilted cavity laser operating in the surface-emitting geometry; a wavelength-stabilized leaky wave laser with reflection from a back side of the substrate; a distributed feedback laser; a microdisk laser; a photonic crystal laser; a laser comprising at least one external mirror; or a laser, wherein at least one mirror is a distributed feedback mirror.

In accordance with again an added feature of the invention, the absorption section is monolithic with the gain section and grown in a single epitaxial process.

In accordance with again an additional feature of the invention, a common medium is used as a gain medium and an electrooptically active medium.

In accordance with a further feature of the invention, the medium used as electro-optically active medium is different from the medium used as a gain medium. In a further preferred implementation, the electrooptic modulator and the active element are placed in mutually different cavities.

In accordance with again a further feature of the invention, the active element may be a quantum well; an array of quantum wires; an array of quantum dots; a stack of quantum wells, quantum wires, or quantum dots; and/or any combination the foregoing.

In accordance with yet an added feature of the invention, the above-outlined data transmission device is commonly fabricated with other devices in an array of devices on a common wafer, and the devices of the array are configured operate independently for multi-channel transmission.

With the above and other objects in view there is also provided, in accordance with the invention, a method of generating pulsed laser light, the method which comprises:

providing a data transmission device that is operable in a pulsed regime, the device having an active section and an absorption section, a waveguide incorporating the active section and the absorption section, and mirrors providing feedback for light, with the waveguide disposed between the mirrors;

applying a forward bias to an active element of the active section; and generating optical gain therein;

transmitting data signals in a frequency-modulated manner;

modulating a refractive index of an additional modulator incorporated in the waveguide of the device such that the repetition frequency of the pulsed laser light is frequency-modulated and frequency-modulated optical data signals are generated.

In a preferred implementation, the pulsed laser light is frequency modulated by switching the repetition frequency between at least two different repetition frequencies.

Other features which are considered as characteristic for the invention are set forth in the appended claims.

Although the invention is illustrated and described herein as embodied in data transmission optoelectronic device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

The preferred embodiments of the present invention will be best understood by reference to the drawings.

It will be readily understood that the devices, as generally described and illustrated in the figures herein, could vary in a wide range. Thus, the following more detailed description of the exemplary embodiments of the present invention, as represented in FIGS. 1-10, is not intended to limit the scope of the invention, as claimed, but is merely representative of a presently preferred embodiment of the invention.

Figure 1:
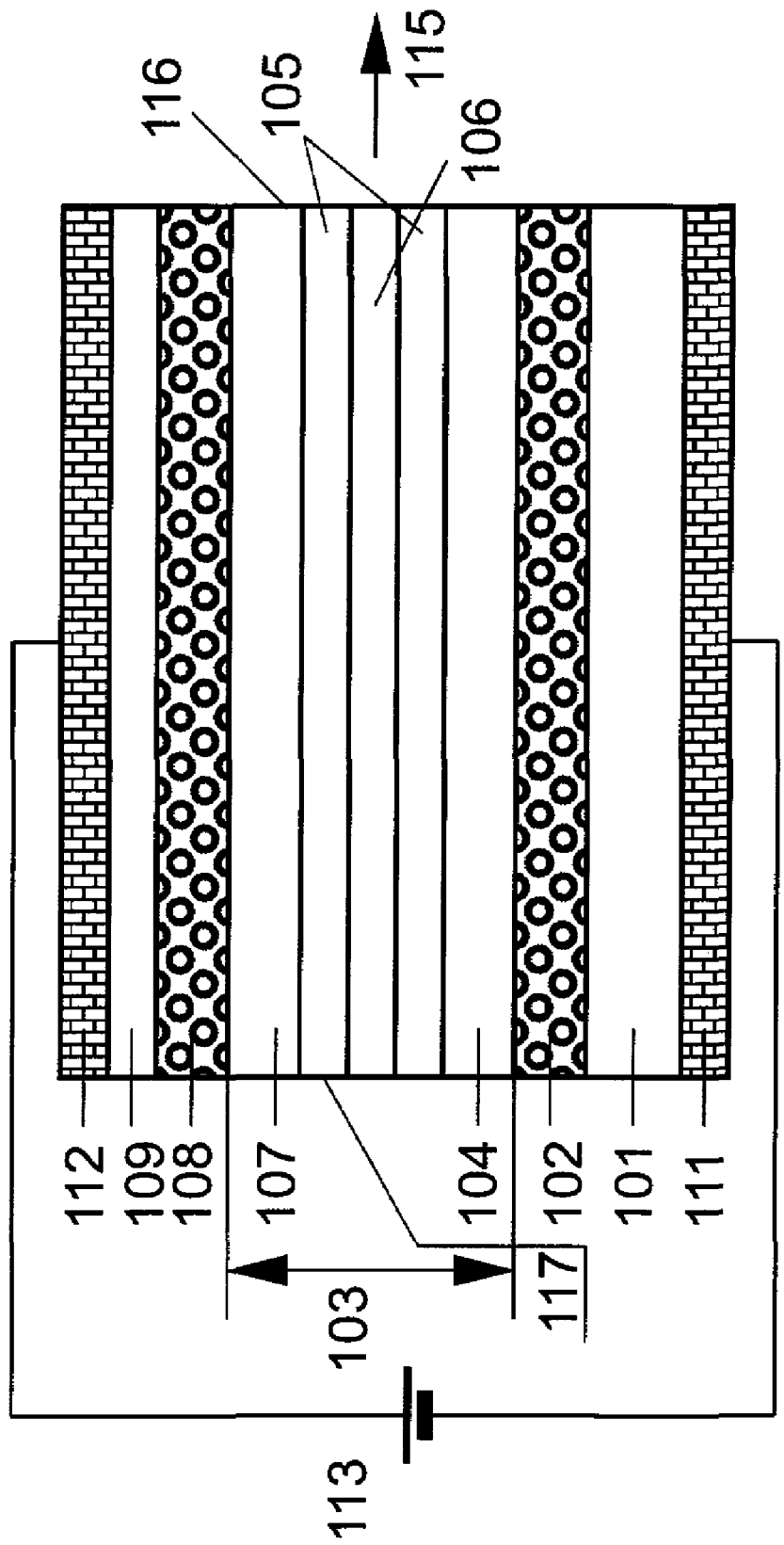
FIG. 1 shows a schematic diagram of a conventional prior art edge-emitting laser.

A prior art semiconductor diode laser, or more specifically, edge-emitting laser, is shown in FIG. 1. The laser structure (100) is grown epitaxially on an n-doped substrate (101). The structure further includes an n-doped cladding layer (102), a waveguide (103), a p-doped cladding layer (108), and a p-contact layer (109). The waveguide (103) includes an n-doped layer (104), a confinement layer (105) with an active region (106) inside the confinement layer, and a p-doped layer (107). The n-contact (111) is contiguous with the substrate (101). A p-contact (112) is mounted on the p-contact layer (109). The active region (106) generates light when a forward bias (113) is applied. The waveguide (103) is bounded in the lateral plane by a front facet (116) and a rear facet (117). If a special highly reflecting coating is put on the rear facet (117), the laser light (115) is emitted only through the front facet (116).

The substrate (101) is formed from any III-V semiconductor material or III-V semiconductor alloy. For example, GaAs, InP, GaSb. GaAs or InP are generally used depending on the desired emitted wavelength of laser radiation. Alternatively, sapphire, SiC or [111]-Si is used as a substrate for GaN-based lasers, i.e. laser structures, the layers of which are formed of GaN, AlN, InN, or alloys of these materials. The substrate (101) is doped by an n-type, or donor impurity. Possible donor impurities include, but are not limited to S, Se, Te, and amphoteric impurities like Si, Ge, Sn, where the latter are introduced under such technological conditions that they are incorporated predominantly into the cation sublattice to serve as donor impurities.

The n-doped cladding layer (102) is formed from a material lattice-matched or nearly lattice-matched to the substrate (101), is transparent to the generated light, and is doped by a donor impurity. In the case of a GaAs substrate (101), the n-doped cladding layer is preferably formed of a GaAlAs alloy.

The n-doped layer (104) of the waveguide (103) is formed from a material lattice-matched or nearly lattice-matched to the substrate (101), is transparent to the generated light, and is doped by a donor impurity. In the case of a GaAs substrate, the n-doped layer (104) of the waveguide is preferably formed of GaAs or of a GaAlAs alloy having an Al content lower than that in the n-doped cladding layer (102).

The p-doped layer (107) of the waveguide (103) is formed from a material lattice-matched or nearly lattice-matched to the substrate (101), is transparent to the generated light, and is doped by an acceptor impurity. Preferably, the p-doped layer (107) of the waveguide is formed from the same material as the n-doped layer (104) but doped by an acceptor impurity. Possible acceptor impurities include, but are not limited to, Be, Mg, Zn, Cd, Pb, Mn and amphoteric impurities like Si, Ge, Sn, where the latter are introduced under such technological conditions that they are incorporated predominantly into the anion sublattice and serve as acceptor impurities.

The p-doped cladding layer (108) is formed from a material lattice-matched or nearly lattice-matched to the substrate (101), transparent to the generated light, and doped by an acceptor impurity. Preferably, the p-doped cladding layer (108) is formed from the same material as the n-doped cladding layer (102), but is doped by an acceptor impurity.

The p-contact layer (109) is preferably formed from a material lattice-matched or nearly lattice matched to the substrate, is transparent to the generated light, and is doped by an acceptor impurity. The doping level is preferably higher than that in the p-cladding layer (108).

The metal contacts (111) and (112) are preferably formed from the multi-layered metal structures. The metal contact (111) is preferably formed from a structure including, but not limited to the structure Ni—Au—Ge. Metal contacts (112) are preferably formed from a structure including, but not limited to, the structure Ti—Pt—Au.

The confinement layer (105) is formed from a material lattice-matched or nearly lattice-matched to the substrate (101), is transparent to the generated light, and is either undoped or weakly doped. The confinement layers are preferably formed from the same material as the substrate (101).

The active region (106) placed within the confinement layer (105) is preferably formed by any insertion, the energy band gap of which is narrower than that of the substrate (101). Possible active regions (106) include, but are not limited to, a single-layer or a multi-layer system of quantum wells, quantum wires, quantum dots, or any combination thereof. In the case of a device on a GaAs-substrate, examples of the active region (106) include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

Figure 2:
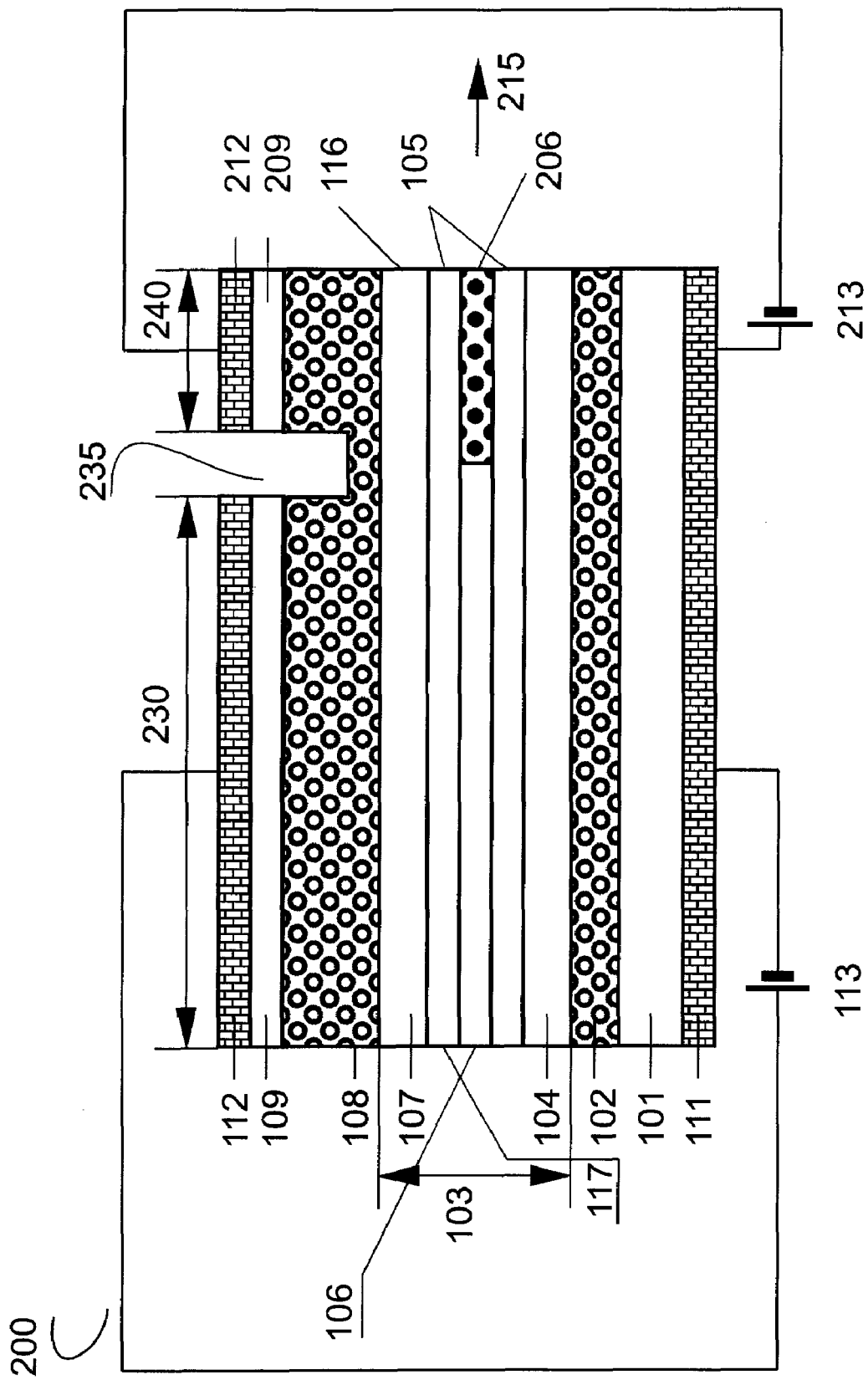
FIG. 2 shows a schematic diagram of a conventional prior art two-sectional mode-locked laser.

FIG. 2 shows schematically a prior art mode-locked edge-emitting laser (200). The laser includes an active section (230) operating under a forward bias (113) and a passive section (or an absorber section) (240) operating under a reverse or zero bias (213). The active region in the first section (106) generates an optical gain, whereas the same region in the passive section (206) operates as a saturable light absorber. The forward bias (113) is applied to the active section (230) through the bottom contact (111) and the first top contact (212). The reverse bias (213) is applied to the passive section (240), electrically separated by etching and (or) ion implantation from the active session, through the bottom contact (111) and the second top contact (262). The top contact layer is separated by a trench (235) into two parts, the top contact layer of the active section (209), and the top contact layer of the absorber section (259). The trench (235) also separates part of the top cladding layer (108). Light comes out (215) of the mode-locked laser in the form of pulses. The repetition frequency depends on the length of the stripe and the group velocity of propagation of the light in the direction along the stripe, $$v = \frac{V_{group}}{L}. \quad (3)$$

The stripe length is defined as a geometrical distance between two facets, the front facet (116), and the rear facet (117).

The disadvantage of the device is the fact that the pulse train can not be modulated in intensity in a simple way. For example, adding an electroabsorption modulator section in fact adds another saturable absorber and causes complex interference and long-lasting transition processes rather than fast intensity modulation.

A reverse bias is usually applied to the absorber section to collect generated nonequilibrium carriers. The application of the reverse bias is not aiming creation of any electrooptic effect. In particular cases the applied voltage may also create a weak positive or negative modulation of the refractive index, depending on the particular structure of the absorption spectrum and the lasing wavelength.

The present invention teaches intentional using of the electrooptic effect, namely electrorefraction effect, i.e. change of the refractive index of the medium upon applied electric field.

Figure 3:
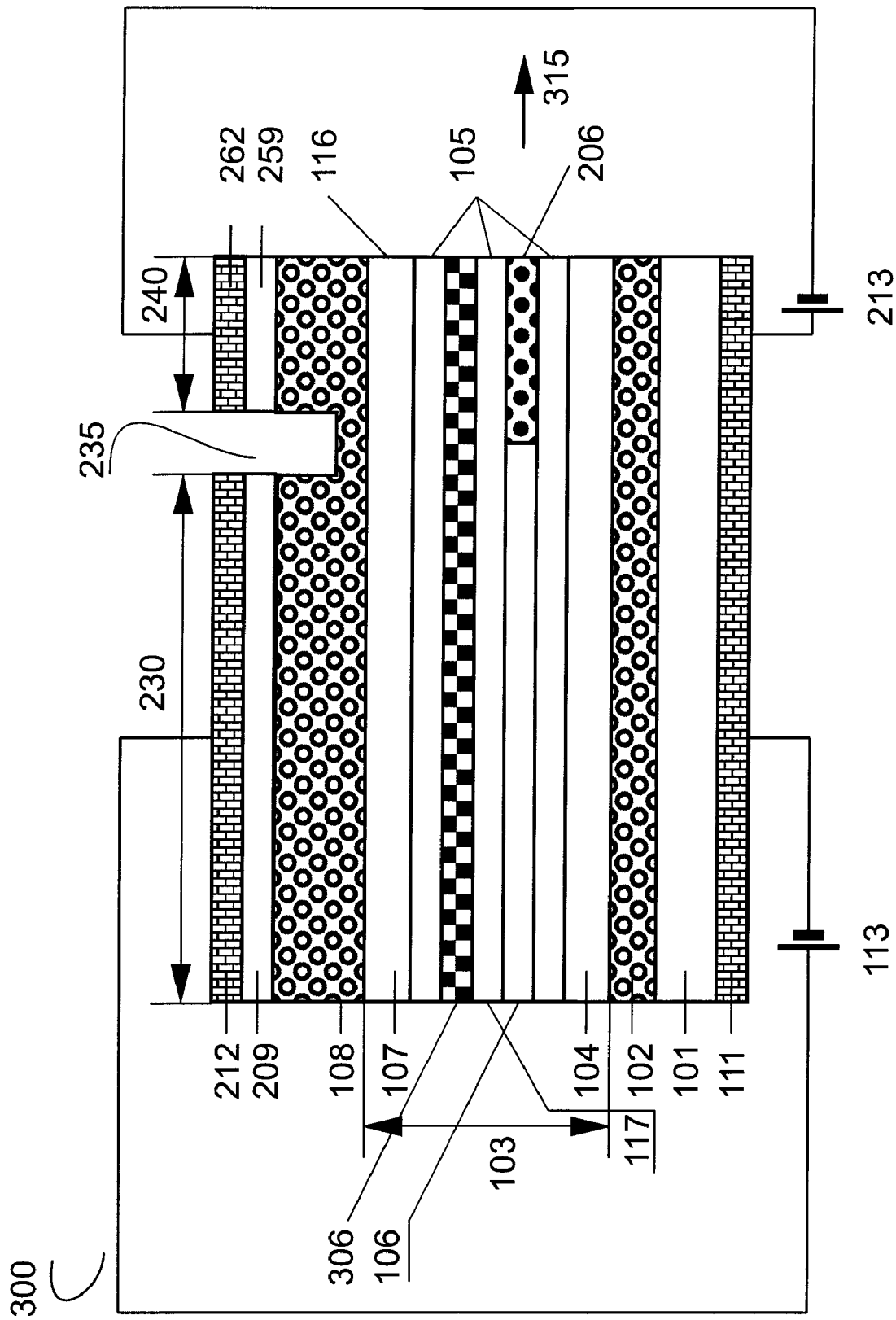
FIG. 3 shows a schematic diagram of an electrooptically-modulated mode-locked laser according to a preferred embodiment of the present invention.

FIG. 3 shows a schematic diagram of electrooptically tuned mode-locked laser (300), according to the preferred embodiment of the present invention. Additionally, a modulator (306) is placed within the confinement layer (105). All the three elements, namely the active region (106), the saturable absorber (206), and the modulator (306) are placed within the same waveguide (103).

By varying a bias voltage (213) applied to the absorber section (204), the refractive index of the modulator element (306) in the absorber section also changes. A particular design of the modulator element can allow a very significant change of the refractive index. The modulator region preferably includes a single or multiple quantum wells, a single or multiple layers of quantum wires, a single or multiple layers of quantum dots, or any combination thereof. Under a reverse bias (213), an electric field applied to the modulator region causes a quantum confined Stark effect. The latter results in a shift of the spectral position of the optical absorption peak. Due to Kramers-Kronig relationship between the real and the imaginary parts of the dielectric functions, a change in the absorption spectrum is accompanied by a corresponding variation of the refractive index.

The functionality of the devices of the present invention is based on electrooptic effects, namely on a change in the refractive index when an electric field is applied. If an electric field is applied perpendicularly to the layers, the conduction and the valence bands of the semiconductor device tilt due to the potential of the external field resulting in the shifting of the energy levels. This results in a smaller absorption energy, and the absorption edge shifts to longer wavelengths. The effect in bulk materials is known as the Franz-Keldysh effect (I. Galbraith, B. Ryvkin "Empirical determination of the electroabsorption coefficient in semiconductors", J. Appl. Phys. 74, 4145 (1993)). A change in the absorption coefficient $\Delta\alpha$ (electroabsorption) results also in a refractive index change $\Delta n$ (electrorefraction). The latter can be calculated by Kramers-Kronig transform, (see, e.g., D. S. Chelma et al. "Room Temperature Excitonic Nonlinear Absorption and Refraction in GaAs/AlGaAs Multiple Quantum Well Structures", IEEE Journal of Quantum Electronics, Vol. QE-20 (3), pp. 265-275 (1984)), $$\Delta n(\omega) = \frac{c}{\pi} P \int_0^\infty \frac{\Delta\alpha(\omega')}{\omega'^2 - \omega^2} d\omega'. \tag{4}$$

where the symbol P indicates that the principal value of the integral has to be evaluated, and c is the velocity of light.

The phenomenon in quantum confined structures like quantum wells, quantum wires or quantum dots is referred to as the Quantum Confined Stark Effect. In realistic electric fields, ranging from zero to a few hundred kV/cm, the electrorefraction is described as a sum of a linear eletrooptical effect (Pockel's effect) and a quadratic electrooptic effect (Kerr effect), (see, e.g. J. E. Zucker, T. L. Hendrickson, and C. A. Burrus, "Electro-optic phase modulation in GaAs/AlGaAs quantum well waveguides", Applied Physics Letters, Vol. 52 (12), pp. 945-947 (1988)).

$$\Delta n = \frac{1}{2} n_0^3 (rF + sF^2), \tag{5}$$

where F is the electric field strength, $n_0$ is the refractive index in the zero electric field, and r and s are the linear and quadratic electrooptic coefficients.

It has been shown by analyzing experimental data on GaAs/GaAlAs quantum well structures, that the quadratic electrooptic effect dominates at electric fields of about 50 kV/cm (see J. S. Weiner et al., "Quadratic electro-optic effect due to the quantum-confined Stark effect in quantum wells", Applied Physics Letters, Vol. 50 (13), pp. 842-844 (1987) and J. E. Zucker et al. "Quaternary quantum wells for electro-optic intensity and phase modulation at 1.3 and 1.55 µm", Applied Physics Letters, Vol. 54 (1), pp. 10-12 (1989)). Furthermore, it has been shown that the quadratic electrooptic coefficient s in GaInAs/in P, GaInAsP/in P, and GaAs/GaAlAs quantum well structures is inversely proportional to the detuning $\Delta\omega$ between the exciton energy in the zero electric field and the photon energy below the bandgap, at which the refractive index is considered, $$\Delta n = \frac{\eta F^2}{\Delta\omega}. \tag{6}$$

Here $\eta$ is the so called figure of merit, which was estimated to be of the order of $3\times10^{-5}$ meV cm$^2$ kV$^2$. The behavior (Eq. (4)) had initially been experimentally studied for quantum wells having the width between 6 and 10 nm, and detunings up to 40 meV. The electrooptic effect decreases at larger detuning (from 40 to 140 meV) much faster than given by Eq. (4) (see M. P. Earnshow and D. W. E. Allshop, "Electrooptic Effects in GaAs—AlGaAs Narrow Coupled Quantum Wells", IEEE Journal of Quantum Electronics, Vol. 37 (7), pp. 897-904; ibid. Vol. 37 (8), p. 1103 (2001); M. V. Kotlyar, et al., "Electrooptic tuning of InP-based microphotonic Fabry-Perot filters", J. Lightwave Technology, vol. 23, PP. 2169-2174 (2005)).

Although the exciton peak absorption decreases significantly upon applied electric field (see, e.g., L. Chen, K. C. Rajkumar, and A. Madhukar, "Optical Absorption and Modulation Behavior of Strained In$_x$Ga$_{1-x}$As/GaAs (100) (x≦0.25 multiple quantum well structure grown via molecular beam epitaxy", Applied Physics Letters, Vol. 57 (23), pp. 2478-2480 (1990)), the exciton line width increases correspondingly. The integral exciton absorption, proportional to the oscillator strength, which can also be roughly estimated to be proportional to the product of the peak absorption by the exciton line width, may either decrease much slower or even remain unchanged.

The exciton oscillator strength in a rather narrow quantum well remains unaffected by an applied electric field if the quantum well width is smaller than one half of the exciton Bohr radius (see Feng et al. "Exciton energies as a function of electric field: Confined quantum Stark effect", Physical Review B, Vol. 48 (3), pp. 1963-1966 (1993)). For InGaAs quantum wells in GaAs, this means quantum wells preferably 7 nm or thinner. The unaffected oscillator strength implies an unaffected integral exciton absorption. Additionally, there is evidence of an increased electrooptic effect in narrow coupled quantum wells.

While selecting particular quantum wells for the modulator for the present invention, as well as particular values of the detuning and electric field, it is important to take into account electrooptic effects and their theoretical modeling, which are published in references cited hereinafter. These references are hereby incorporated herein by reference:

[1]. A. G. Weber, Wu Ronghan and D. Bimberg "High-frequency response of p-substrate buried crescent InGaAsP lasers" J. Appl. Phys. 68, 2499 (1990).

[2]. D. Tauber, G. Wang, R. S. Geds, J. E. Bowers, and L. A. Coldren, "70 GHz relaxation oscillation in vertical cavity surface emitting laser," IEEE Trans. Electron. Devices, 39, p. 2652 (1992).

[3]. D. Tauber, G. Wang, R. S. Geds, J. E. Bowers, L. A. Coldren," 70 GHz relaxation oscillation in a vertical cavity surface emitting laser" Device Research Conference, 1992. Digest. 50th Annual, Jun. 22-24, 1992 pp.: 0_81-0_82

[4]. S. M. Kim, Y. Wang, M. Keever, and J. S. Harris "High-Frequency Modulation Characteristics of 1.3-□m InGaAs Quantum Dot Lasers" IEEE Phot. Technol. Lett. 16, pp. 377-379, (2004)

[5]. S. Weisser, E. C. Larkins, K. Czotscher, W. Benz, J. Daleiden, I. Esquivias, J. Fleissner, J. D. Ralston, B. Romero, R. E. Sah, A. Schonfelder, J. Rosenzweig, "Damping-limited modulation bandwidths up to 40 GHz in undoped short-cavity In0.35Ga0.65As—GaAs multiple-quantum-well lasers" IEEE Photon. Technol. Lett. 8, pp. 608-610 (1996).

[6]. T. Yoshie, O. Painter, A. Scherer, D. Huffaker, D. Deppe, "Photonic crystal defect microcavities with indium arsenide quantum dots" Lasers and Electro-Optics Society 2000 Annual Meeting. LEOS 2000. 13th Annual Meeting. IEEE, Volume: 2, 13-16 Nov. 2000 pp. 415-416 vol. 2.

[7]. N. Ledentsov, D. Bimberg, V. M. Ustinov, M. V. Maximov, Zh. I. Alferov, V. P. Kalosha and J. A. Lott "Interconnection between gain spectrum and cavity mode in a quantum dot vertical cavity laser" Semicond. Sci. Technol. 14, pp. 99-102 (1999).

[8]. R. King "2D VCSEL Arrays for Chip-Level Optical Interconnects" Annual report 1999, Dept. of Optoelectronics, University of Ulm.

[9]. A. N. Al-Omari, K. L. Lear, "Polyimide-planarized vertical-cavity surface-emitting lasers with 17.0-GHz bandwidth" IEEE Photon. Technol. Lett., vol. 16, pp. 969-971 (2004).

[10]. P. Pepeljugoski, D. Kuchta, Y. Kwark, P. Pleunis, G. Kuyt, "15.6-Gb/s transmission over 1 km of next generation multimode fiber", IEEE Photon. Technol. Lett. 14 pp: 717-719 (2002).

[11]. D. M. Kuchta, P. Pepeljugoski, Y. Kwark, "VCSEL modulation at 20 Gb/s over 200 m of multimode fiber using a 3.3 V SiGe laser driver IC" Advanced Semiconductor Lasers and Applications/Ultraviolet and Blue Lasers and Their Applications/Ultralong Haul DWDM Transmission and Networking/WDM Components, 2001 Digest of the LEOS Summer Topical Meetings, 30 Jul.-1 Aug. 2001 Pages: 2.

[12]. Won-Jin Choi, A. E. Bond, Jongwoo Kim, Jiaming Zhang, R. Jambunathan, H. Foulk, S. O'Brien, J. Van Norman, D. Vandegrift, C. Wanamaker, J. Shakespeare, He Cao "Low insertion loss and low dispersion penalty InGaAsP quantum-well high-speed electroabsorption modulator for 40-Gb/s very-short-reach, long-reach, and long-haul applications" Journal of Lightwave Technology 20, pp. 2052-2056 (2002).

[13]. N. Mineo, K. Yamada, K. Nakamura, S. Sakai, and T. Ushikubo, "60-GHz band electroabsorption modulator module," in Proc. OFC 1998, 1998, ThH4.

[14]. F. Devaux, P. Bordes, A. Ougazzaden, M. Carre, and F. Huff, "Experimental optimization of MQW electroabsorption modulators with up to 40 GHz bandwidths," Electron. Lett., vol. 30, pp. 1347-1348 (1994).

[15]. A. H. Steinbach, I. Penn, N. Chokshi, D. Martin, K. Slomkowsk, W. Baun, N. Agrawal, R. Ben-Michael, M. A. Itzler, "Equivalent circuit modelling of p-i-n photodiodes for 40 Gb/s receivers" Lasers and Electro-Optics Society, 2002. LEOS 2002. The 15th Annual Meeting of the IEEE Volume: 2, 10-14 Nov. 2002, Pages: 486-487 vol. 2.

[16]. E. Alekseev, D. Pavlidis, V. Ziegler, M. Berg, J. Dickmann "77 GHz high-isolation coplanar transmit-receive switch using InGaAs/InP PIN diodes" Gallium Arsenide Integrated Circuit (GaAs IC) Symposium, 1998. Technical Digest 1998, 20th Annual Meeting, 1-4 Nov. 1998. Pages: 177-180.

[17]. Y. Muramoto, T. Ishibashi "InP/InGaAs pin photodiode structure maximising bandwidth and efficiency" Electronics Letters 39, 1749-1750 (2003).

[18]. A. Umbach, T. Engel, H.-G. Bach, S. van Waasen, E. Droge, A. Strittmatter, W. Ebert, W. Passenberg, R. Steingruber, W. Schlaak, G. G. Mekonnen, G. Unterborsch, D. Bimberg, "Technology of InP-based 1.55-μm ultrafast OEMMICs: 40-Gbit/s broad-band and 38/60-GHz narrow-band photoreceivers" IEEE J. Quantum Electron. 35, pp. 1024-1031 (1999).

[19] H. Feng et al., "Field-induced optical effect in a five-step asymmetric coupled quantum well with modified potential," IEEE J. Quantum. Electron., vol. 34, pp. 1197-1208 (1998).

[20] M. P. Earnshaw and D. W. E. Allsopp, "Electrooptic effect in GaAs—AlGaAs narrow coupled quantum wells", IEEE J. Quantum. Electron., vol. 37, pp. 897-904 (2001).

[21] M. V. Kotlyar, L. O'Faolain, A. B. Krysa, and Th. F. Krauss, "Electrooptic tuning of InP-based microphotonic Fabry-Perot filters", J. Lightwave Technology, vol. 23, PP. 2169-2174 (2005).

[22] N. N. Ledentsov, V. A. Shchukin, and D. Bimberg, "Merging Nanoepitaxy and Nanophotonics". In: "Future Trends in Microelectronics: Up the Nano Creek", ed. by. S. Luryi, J. Xu, and A. Zaslavsky, Wiley & Sons, New York (2006).

[23] I. Galbraith, B. Ryvkin "Empirical determination of the electroabsorption coefficient in semiconductors", J. Appl. Phys. 74, 4145 (1993)

[24] D. S. Chelma et al. "Room Temperature Excitonic Nonlinear Absorption and Refraction in GaAs/AlGaAs Multiple Quantum Well Structures", IEEE Journal of Quantum Electronics, Vol. QE-20 (3), pp. 265-275 (1984).

[25] J. E. Zucker, T. L. Hendrickson, and C. A. Burrus, "Electro-optic phase modulation in GaAs/AlGaAs quantum well waveguides", Applied Physics Letters, Vol. 52 (12), pp. 945-947 (1988).

[26] J. S. Weiner et al., "Quadratic electro-optic effect due to the quantum-confined Stark effect in quantum wells", Applied Physics Letters, Vol. 50 (13), pp. 842-844 (1987).

[27] J. E. Zucker et al. "Quaternary quantum wells for electro-optic intensity and phase modulation at 1.3 and 1.55 μm", Applied Physics Letters, Vol. 54 (1), pp. 10-12 (1989).

By varying the reverse bias voltage (213) applied to the absorber section (240), the refractive index of the modulating element (306) changes. Therefore, the group velocity $V_{group}$ of the optical mode propagating between two facets, also changes, thus changing the repetition frequency v of pulses.

In a different embodiment of the present invention, the modulator region operates under a forward bias. This causes the exciton bleaching effect that changes the optical absorption peak and thus affects the refractive index of the modulator.

Figure 4:
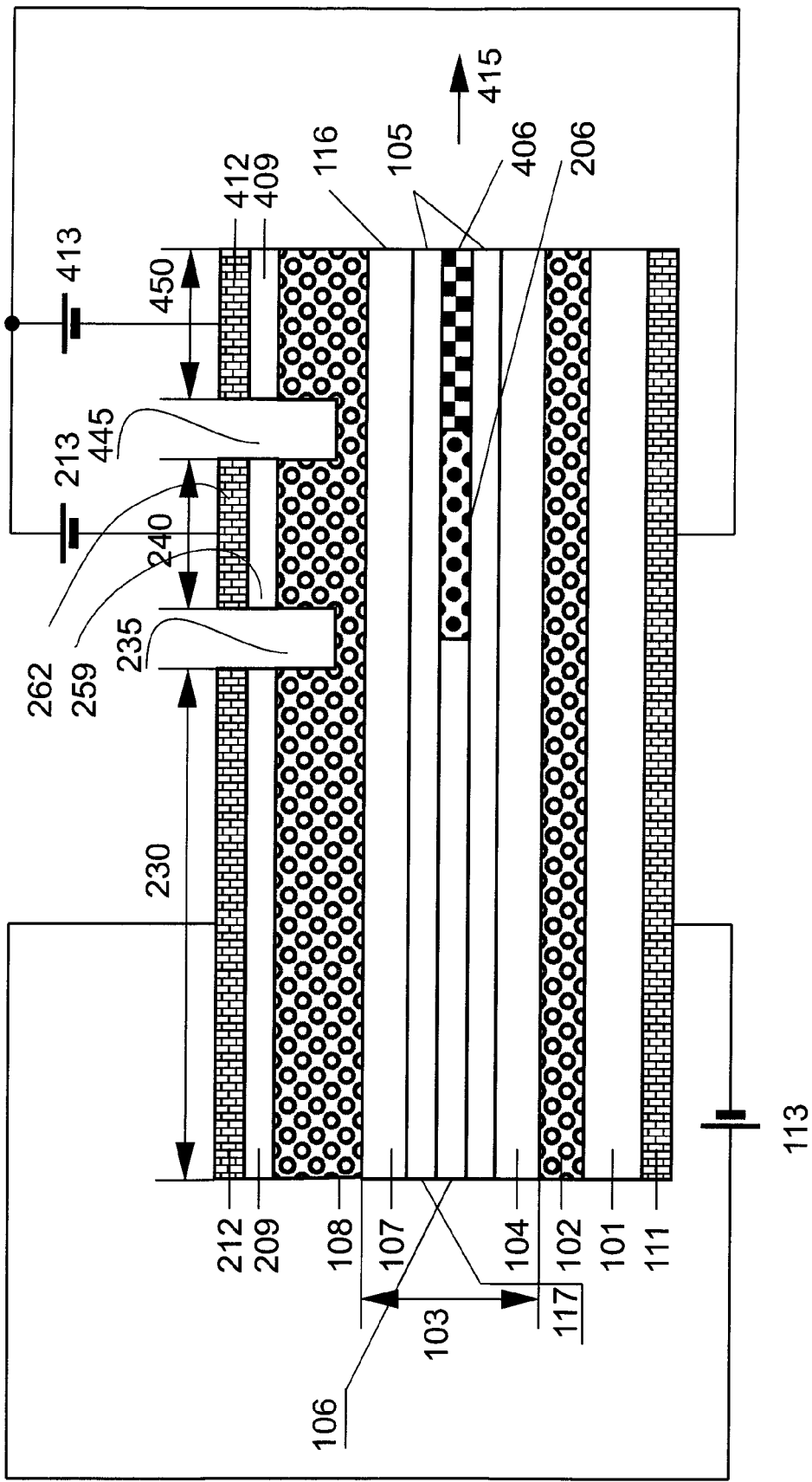
FIG. 4 shows a schematic diagram of an electrooptically-modulated mode-locked laser according to one another embodiment of the present invention.

Electrooptic effect can be further increased by adding an additional cavity section, which is operating at voltage, optimal for the electrooptic modulation of the refractive index, while the other cavity section is used for the effective saturable absorption. FIG. 4 shows schematically an electrooptically-modulated mode-locked laser (400) according to this embodiment of the present invention. The laser includes the active section (230), the absorber section (240), and the modulator section (450). The active section (230) and the absorber section (240) are separated by the trench (235), and the absorber section (204) and the modulator section (450) are separated by the trench (445). The trenches divide the top contact into three contacts. The forward bias (113) is applied to the active section via the bottom contact (111) and the first top contact (212). The zero or reverse bias (213) is applied to the absorber section (240) via the bottom contact (111) and the second top contact (262). The reverse bias (413) is applied to the modulator section (450) via the bottom contact and the third top contact (412). The two trenches (235) and (445) split the top contact layer into a first contact layer (209), the second contact layer (259), and the third contact layer (409). The two trenches also divide the part of the top cladding layer (108).

The active layer (106) in the active section (230) generates optical gain when a forward bias is applied. The same layer in the absorber section (240) operates as a saturable absorber (206). The same layer in the modulator section (450) operates as a modulator element (406). Three devices are used to apply bias to three sections independently. A forward bias (113) is applied to the active section (230). A reverse bias (213) is applied to the absorber section (240) resulting in a self-pulsating operation of the device. A reverse bias (413) is applied to the modulator section (450). A reverse bias (413) creates an electric field affecting the refractive index of the modulator element (406), thus varying the effective group refractive index of the optical modes in the laser. The repetition frequency of pulses in the outgoing laser light (415) can thus be varied by the bias voltage (413). It should be noted, that in the embodiment of FIG. 4, the active region (106), the saturable absorber (206), and the modulator (406) are placed within the same waveguide (103), bounded by the bottom cladding layer (102), the top cladding layer (108), the front facet (116), and the rear facet (117).

In one another embodiment of the present invention, the three sections of the device (400), namely the active section (230), the absorber section (240), and the modulator section (450) can be placed in a different sequence.

Figure 5:
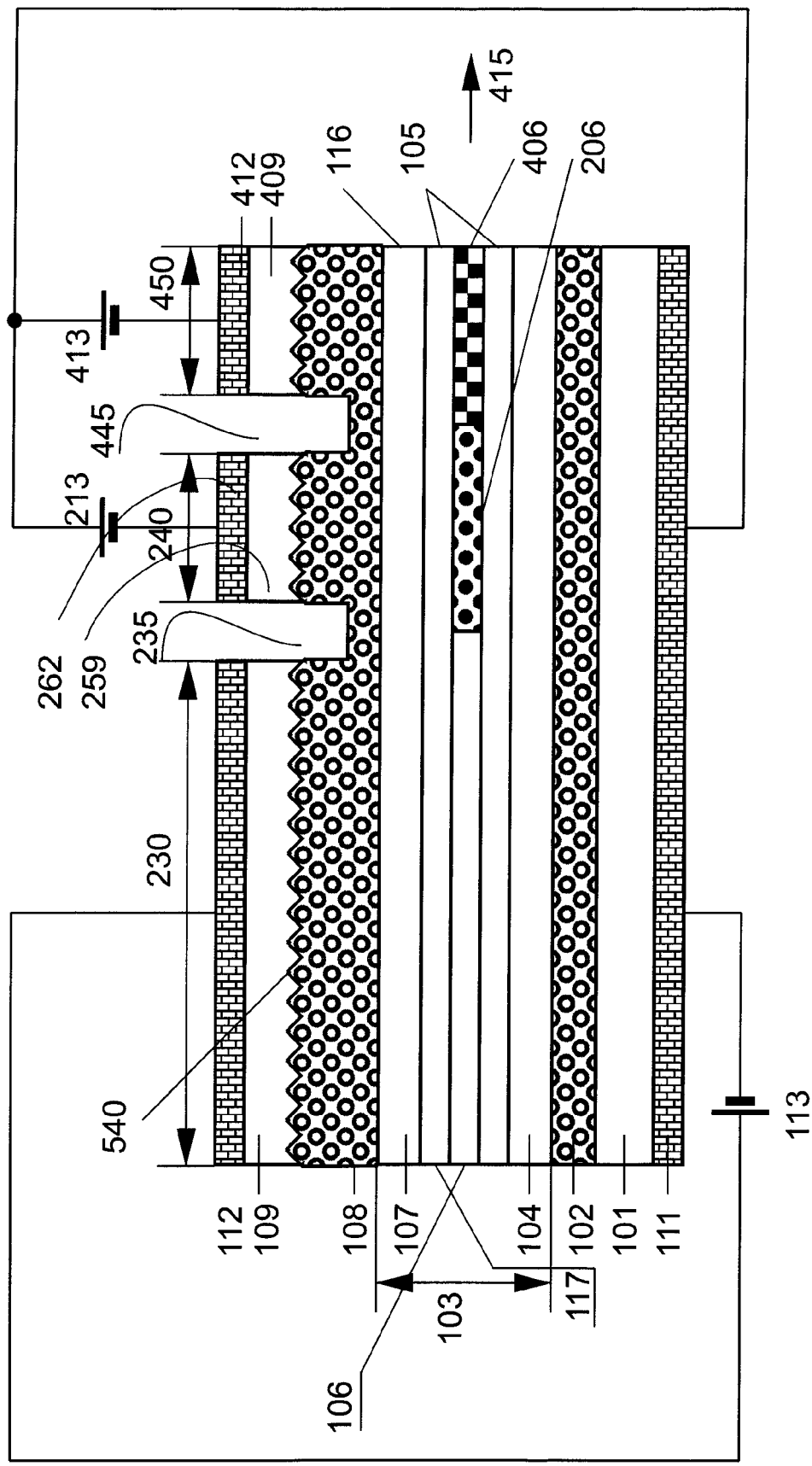
FIG. 5 shows a schematic diagram of an electrooptically modulated mode-locked distributed feedback laser, according to one another embodiment of the present invention.

FIG. 5 shows schematically an electrooptically-modulated distributed feedback mode-locked laser (500), according to one another embodiment of the present invention. A periodic grating (540) defines a single wavelength, for which the feedback occurs. The laser operates thus as a wavelength-stabilized laser. The absorber section (240) allows the laser to operate as a mode-locked laser, and the modulator section (450) allows to tune the repetition frequency of the laser pulses. In this embodiment, the active region (106), the saturable absorber (206), and the modulator (406) are placed within the same waveguide (103), bounded by the bottom cladding layer (102), the top cladding layer (108), the front facet (116), and the rear facet (117).

Figure 6:
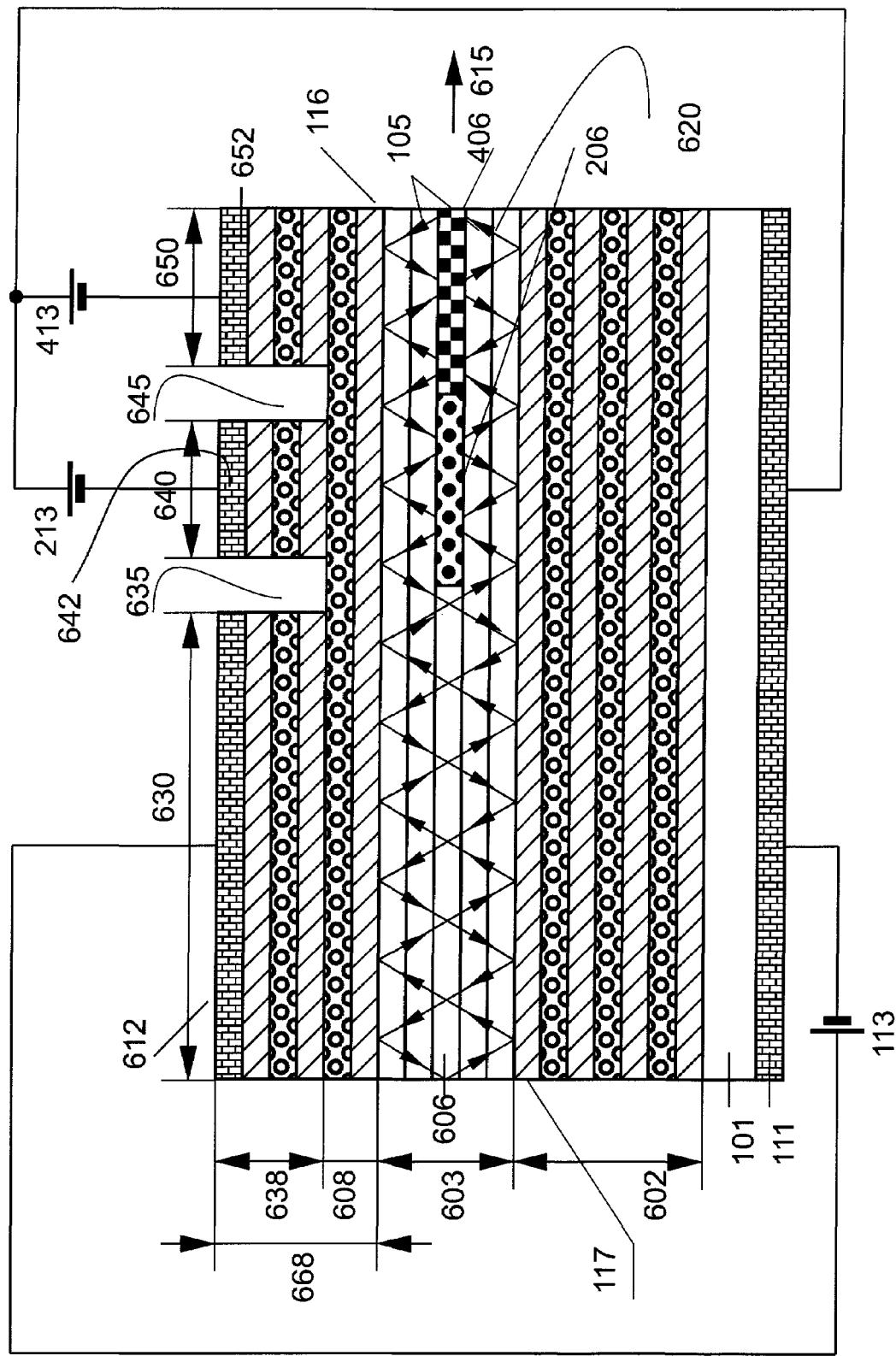
FIG. 6 shows a schematic diagram of a two-sectional vertical cavity surface emitting laser with an electrooptically modulated saturable absorber, according to yet another embodiment of the present invention.

FIG. 6 shows schematically an electrooptically-modulated tilted cavity mode-locked laser (600), according to yet another embodiment of the present invention. The concept of a tilted cavity laser has been proposed by the inventors of the present invention (N. N. Ledentsov and V. A. Shchukin, "Tilted cavity semiconductor laser (TCSL) and method of making same", U.S. Pat. No. 7,031,360; "Tilted cavity semiconductor optoelectronic device and method of making same", U.S. published patent application 2005/0040410, which are incorporated here as a reference). A tilted cavity laser operates in a high-order (tilted) vertical optical mode, the effective mode angle of which is an intermediate one between the effective mode angle in a typical edge-emitting laser and that in a typical VCSEL. A tilted cavity laser contains a high-finesse cavity and at least one multilayer interference reflector (MIR). A cavity and a MIR are constructed such that the resonance features of the two elements coincide at only one angle and one wavelength. The spectral position of the reflectivity dip of the high-finesse cavity as a function of the tilt angle follows a first dispersion law, and the spectral position of the reflectivity stopband maximum of a MIR follows a second dispersion law. The two curves intersect at only one angle. This implies that an optical mode confined in a high-finesse cavity at the optimum wavelength, propagates at the corresponding tilt angle, for which the MIR has a strong reflectivity. This means a low leakage loss of the optical mode to the substrate and/or contact layers. If the wavelength deviates from the optimum value, the features of the cavity and the MIR no longer match, and the optical mode has a high leakage loss. Thus, a tilted cavity laser provides a wavelength selectivity and, thus, lasing at the optimum wavelength corresponding to the minimum leakage loss of the optical mode. This means that a tilted cavity laser allows a wavelength-stabilized operation.

The embodiment of FIG. 6 is an electrooptically-tuned tilted cavity mode-locked laser (600) comprising a cavity (603), a bottom MIR (602), and a top MIR (668). The laser is grown epitaxially on an n-doped substrate (101). The bottom MIR (602) is n-doped, and the top MIR (668) is p-doped. The cavity (603) comprises n-doped layer (604), a confinement layer (605) with an active region inside the confinement layer, and a p-doped layer (607). The cavity (603), the bottom MIR (602), and the top MIR (668) are selected such that lasing occurs in a tilted optical mode (620) having a minimum optical loss. The laser includes an active section (630), an absorber section (640), and a modulator section (650). The forward bias (113) is applied to the active section through the bottom contact (111) and a first top contact (612). The reverse or zero bias is applied to the absorber section (640) through the bottom contact (111) and a second top contact (642). The reverse bias (413) is applied to the modulator section (650) through the bottom contact (111) and the third top contact (652). The absorber section (640) is separated from the active section (630) by a trench (635) and from the modulator section (650) by a trench (645). The trenches are preferably formed by etching and/or ion implantation. The top MIR (668) is etched to separate the paths for the current spreading in the active and the absorber section, and in the absorber and the modulator section.

The repetition frequency of the mode-locked laser depends on the length of the stripe and the group velocity of propagation of the light in the direction along the stripe. The stripe length is defined by the geometrical distance between the two facets, and for FIG. 6 equals the aggregated lengths of the sections (630), (635), (640), (645), and (650). The same layer operates as an active layer (606) in the active section (630), the saturable (206) absorber in the absorber section (640), and a modulator (406) in the modulator section (650). Applying a reverse bias (413) to the modulator section (650) results in a change of the refractive index of the modulator (406), and, therefore in a change of the averaged group velocity of the optical mode. This results in a change of the repetition frequency of the pulsed laser light (615). The specific feature of the embodiment of FIG. 6 is that the tilted cavity laser provides a wavelength stabilized laser light, whereas the repetition frequency of the light pulses is tuned by the bias (413) applied to the modulator section (650). In the embodiment of FIG. 6, the active region (106), the saturable absorber (206), and the modulator (406) are placed within the same cavity (603), bounded by the bottom MIR (602), the top MIR (668), the front facet (116), and the rear facet (117).

Figure 7:
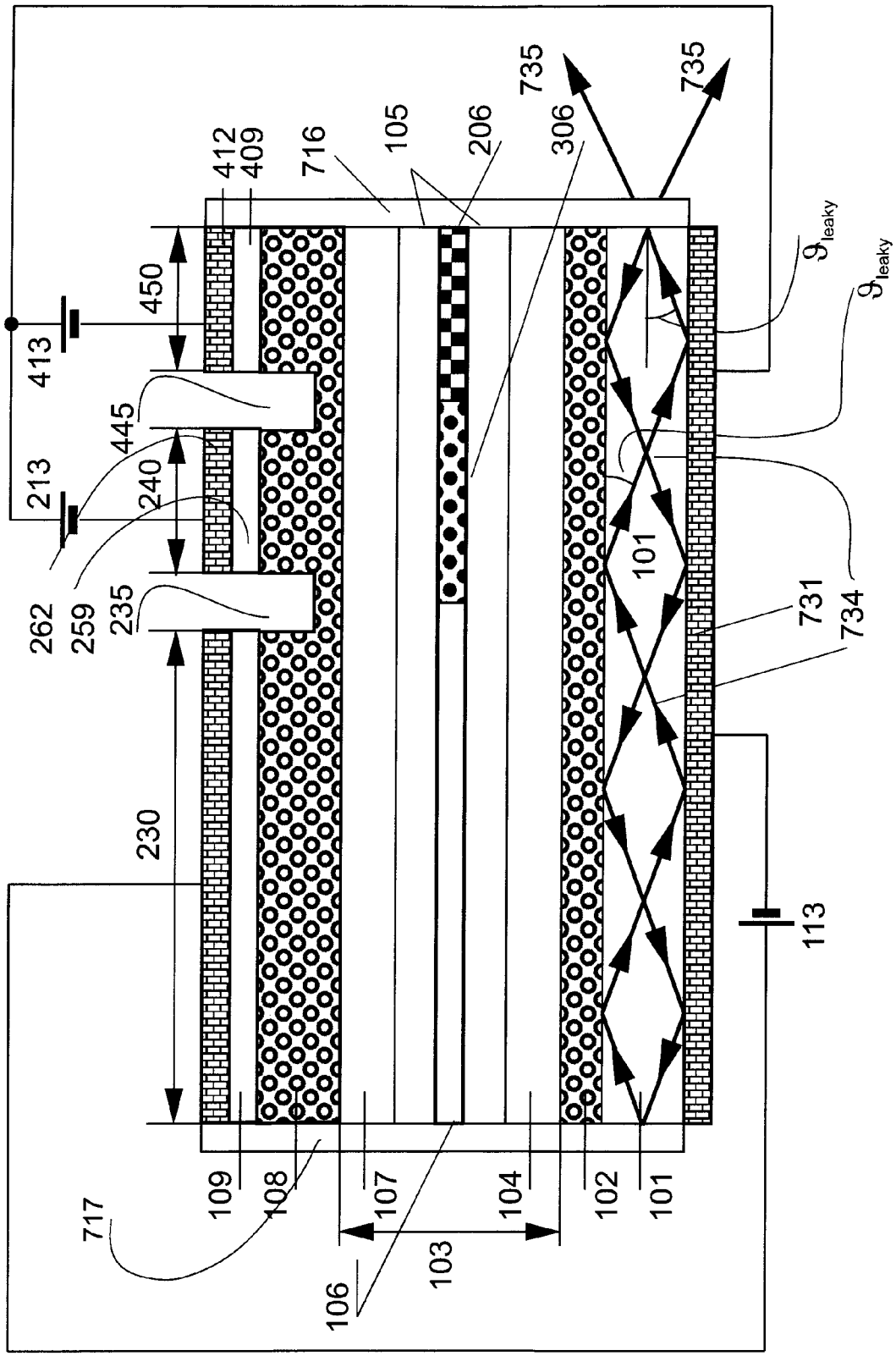
FIG. 7 shows a schematic diagram of an electrooptically-modulated tilted cavity mode-locked laser, operating in a wavelength-stabilized regime due to the reflection of light from the back substrate side, according to yet another embodiment of the present invention.

FIG. 7 shows schematically an electrooptically-modulated mode-locked laser according to yet another embodiment of the present invention. The device operates as follows. The active region (106) generates gain, when a forward bias (113) is applied. The waveguide (703) is a leaky waveguide. Light generated in the leaky waveguide (703) leaks to the substrate (101). Light in the substrate propagates (734) at a certain leaky angle $\Theta_{leaky}$ to the plane of the substrate surface. Light is reflected back from the back surface (731) of the substrate. Thus, the external resonator is formed between the leaky waveguide (703) and the back surface of the substrate (731). Since the thickness of the substrate significantly exceeds the wavelength of light in the vacuum (preferred wavelengths of light range between 300 nm and 30 □m), the propagation of light in the substrate obeys the laws of geometrical optics. Therefore, in order to allow the exit of light from the substrate through the facet, it is necessary that the leaky angle $\Theta_{leaky}$ is below the angle of the total internal reflection at the semiconductor-air interface. Then, light comes out (735) through the front facet forming preferably a two-lobe far-field pattern with narrow lobes. An antireflecting coat (716) is preferably deposited on a front facet, and a highly reflecting coat (717) is preferably deposited on a rear facet.

If the back surface of the substrate (731) is polished the light reflects back to the active region layer (106) and no significant part of the light is lost. The threshold current density is low, even if the nominal leakage loss of the leaky waveguide (703) is high. Moreover, the light interferes and only certain wavelengths result in constructive interference resulting is wavelength selectivity. In different approaches, the back side of the substrate may be coated, etching may be applied to enable wavelength adjustment, gratings can be deposited to additionally improve wavelength stabilization or enabling grating outcoupling of the light through the substrate, and so on. One or a few coatings can be deposited on the back surface of the substrate to protect the mirror-like quality of the surface.

Thus, the device provides a wavelength-stabilized lasing, which was disclosed by the inventors of the present invention (N. N. Ledentsov et al., in In: "Future Trends in Microelectronics: Up the Nano Creek", ed. by. S. Luryi, J. Xu, and A. Zaslavsky, Wiley & Sons, New York (2006)).

The laser of the present invention contains, in addition, the absorber section (240) which enables the laser operating as a mode-locked laser, and the modulator section (450) providing a possibility of the electrooptic tuning the refractive index of the modulator region (406), and, thus, of the repetition frequency of the laser light pulses.

Figure 8:
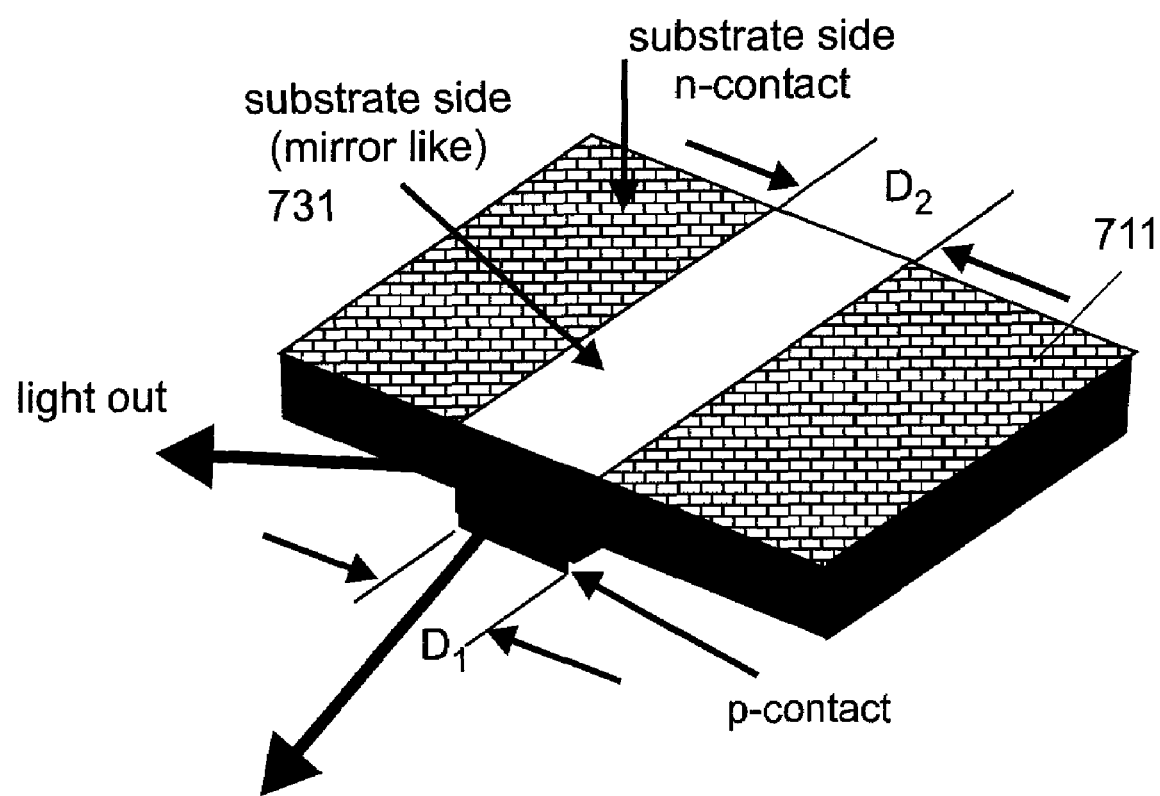
FIG. 8 shows a schematic diagram of a device of the embodiment of FIG. 7, with an example of one of possible processing layouts.

FIG. 8 shows a schematic diagram of a device of the embodiment of FIG. 7 with an example of one of possible processing layouts. The n-contact (711) is mounted only on a part of the back side of the substrate, whereas the part of the substrate (731) remains mirror-like allowing a mirror reflection of light impinging from the substrate onto the back substrate surface.

Figure 9:
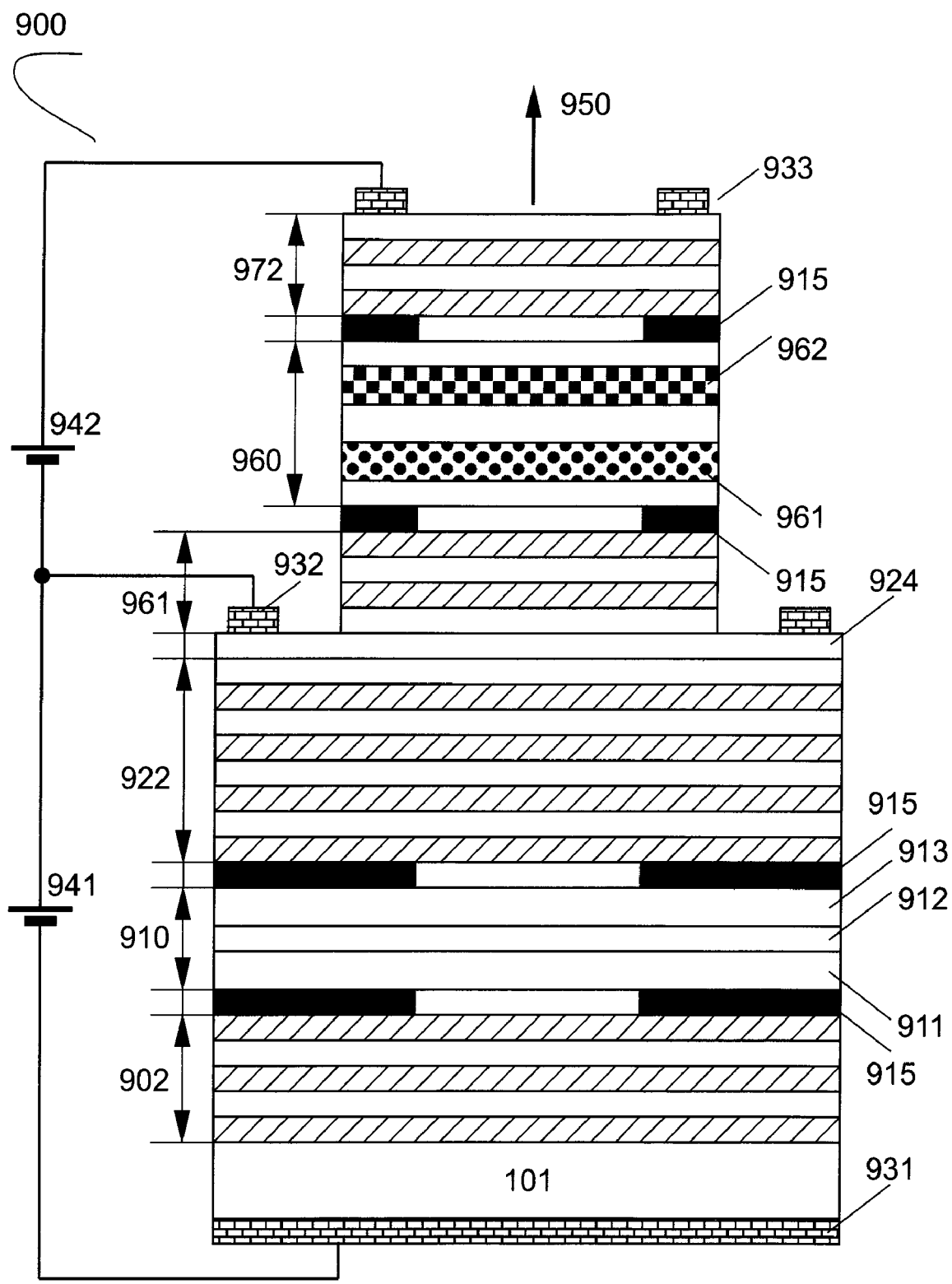
FIG. 9 shows a schematic diagram of a two-sectional vertical cavity surface emitting laser with an electrooptically modulated saturable absorber, according to yet another embodiment of the present invention.
Figure 10:
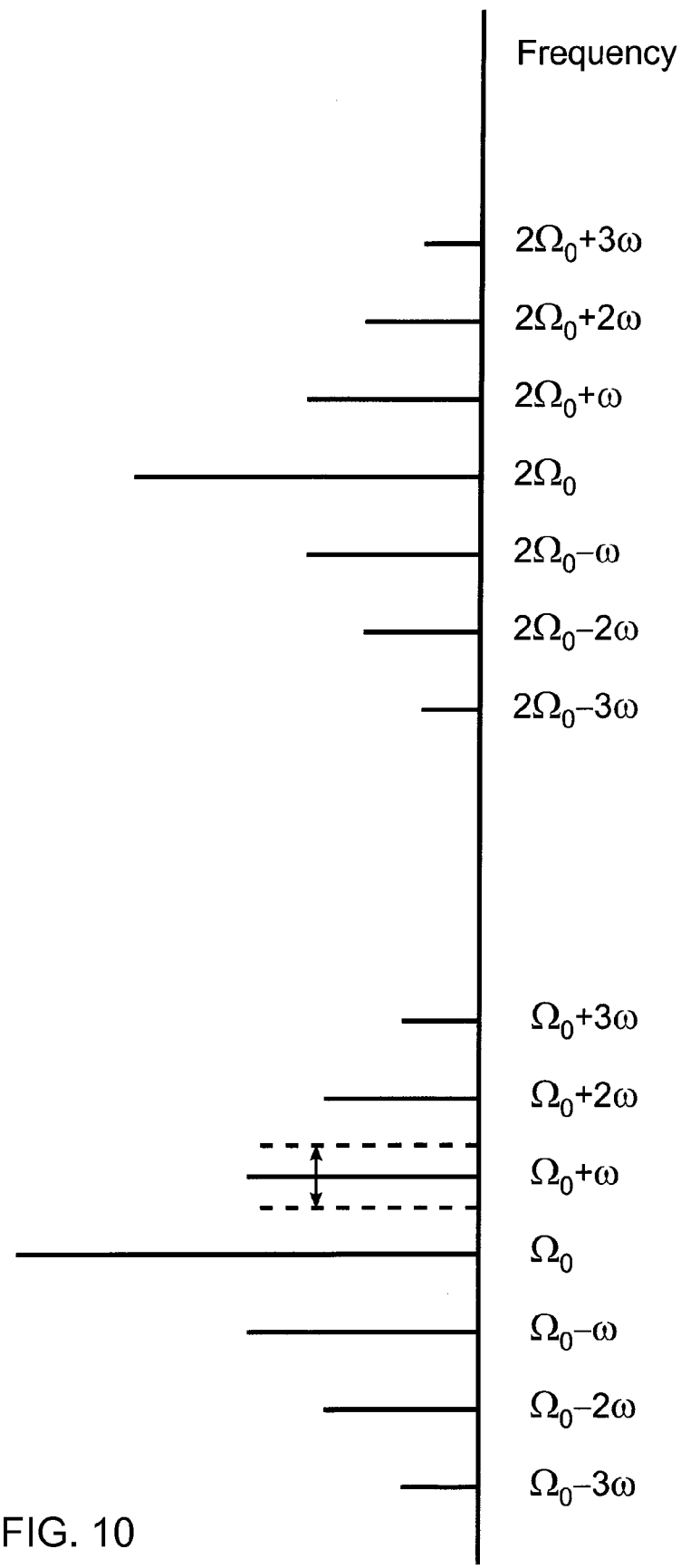
FIG. 10 shows a schematic diagram of the frequency spectrum of a frequency-modulated optical signal having a carrier frequency $\Omega_0$ and a modulation frequency $\omega$.

FIG. 9 shows schematically an electrooptically-modulated mode-locked vertical cavity surface emitting laser (900) according to one another embodiment of the present invention. The device (900) includes a substrate (101), a first distributed Bragg reflector (902), a first cavity (910), a second distributed Bragg reflector (922), a third distributed Bragg reflector (932), a second cavity (960), and a fourth distributed Bragg reflector (972). The cavity (910) includes an active region (912).

The part of the device (900), including the substrate (101), the first distributed Bragg reflector (902), the first cavity (910) including the active region (912), and the second distributed Bragg reflector (922), operates as a vertical cavity surface emitting laser.

The substrate (101) is preferably formed from any III-V semiconductor material or III-V semiconductor alloy, e.g. GaAs, InP, GaSb. GaAs or InP are preferably used depending on the desired emitted wavelength of laser radiation. Alternatively, sapphire, SiC or Si(111) may be used as substrates for GaN-based lasers, i.e. laser structures the layers of which are formed of GaN, AlN, InN, or alloys of these materials. The substrate 101 is doped by an n-type, or donor impurity. Possible donor impurities include, but are not limited to, S, Se, Te, and amphoteric impurities like Si, Ge, Sn where the latter are introduced under such technological conditions that they are incorporated predominantly into the cation sublattice and serve as donor impurities. Any substrate orientation including, but not limited to, (100), (110), (111), or a high Miller index substrate, may be used.

The first distributed Bragg reflector (902) preferably includes a periodic structure of layers, transparent for the generated laser light, having alternating high and low refractive indices and is n-doped. The layers are formed of the materials preferably lattice-matched or nearly lattice-matched to the substrate (101). In a GaAs-based device, the layers of the first distributed Bragg reflector are preferably formed of GaAs and GaAlAs, or of layers of GaAlAs with alternating Al content.

The first cavity (910) preferably includes an undoped or a weakly n-doped layer (911), an active region (912), and an undoped or weakly p-doped layer (913). Layers (911) and (913) are formed of materials, lattice-matched or nearly lattice-matched to the substrate (101), and transparent to the generated laser light.

The active region (912) is formed of any insertion or combinations of insertions, including a double heterostructure, a quantum well, an array of quantum wires, and arrays of quantum dots, or any combination thereof. The active region (912) generates light, when a forward bias (941) is applied.

For structures grown on a GaAs substrate, materials for the active region include, but are not limited to, GaAs, InGaAs, GaAsSb, GaAsP, GaAlAs, InGaAsN, and InGaAsNSb. For structures grown on sapphire, SiC, or Si(111), materials for the active region include, but are not limited to, InGaN, InGaAlN, and InGaAlNAs. For structures grown on InP, materials for the active region include, but are not limited to, InGaAs, InGaAlAs, InGaAsSb, InGaAsP, and InGaAsN.

A forward bias (941) is applied via a first contact (931) (an n-contact) and a second contact (932) (a p-contact). The contacts (931) and (932) are preferably formed from the multi-layered metal structures. The contact (931) is preferably formed from the structures including, but not limited to, the structure Ni—Au—Ge. The contact (932) is preferably formed from structures including, but not limited to, the structure Ti—Pt—Au.

The p-contact (932) is preferably mounted on a current spreading p-layer (924). The current spreading p-layer (924) is preferably formed of a material lattice-matched or nearly lattice-matched to the substrate (101), transparent to the generated laser light and p-doped, i.e. doped by an acceptor impurity. Possible acceptor impurities include, but are not limited to, Be, Mg, Zn, Cd, Pb, Mn and amphoteric impurities like Si, Ge, Sn where the latter are introduced under such technological conditions that they are incorporated predominantly into the anion sublattice and serve as acceptor impurities.

The second cavity (960) contains a saturable absorber (961) and a modulator (962). The saturable absorber (961) preferably is formed of quantum insertions, namely quantum wells, arrays of quantum wires, arrays of quantum dots, either a single-layer or multilayer, or any combination thereof. The quantum insertions are selected such that they absorb emitted light, if a zero or reverse bias is applied, and their absorption coefficient decreases as a function of the optical power density, allowing the device operating in a self-pulsating regime.

The modulator (962) includes one or more quantum wells, one or more layers of quantum wires or quantum dots, or any combination thereof. In the particular embodiment of FIG. 9, the modulator (962) operates when a reverse bias (942) is applied. The operation of the modulator is based on the quantum confined Stark effect.

Reverse bias (942) is applied to both the saturable absorber (961) and the modulator (962) via the second contact (932) (p-contact) and the third contact (933) (n-contact). The third distributed Bragg reflector (971) is preferably formed of a periodic structure of alternating layers having a high and a low refractive index and is p-doped. The layers are preferably formed of materials lattice-matched or nearly lattice-matched to a substrate, transparent to generated laser light and n-doped.

Current apertures (915) separate the first distributed Bragg reflector (902) from the first cavity (910), the first cavity (910) from the second distributed Bragg reflector (922), the third distributed Bragg reflector (971) from the second cavity (960), and the second cavity (960) from the fourth distributed Bragg reflector (972). The current apertures (915) are preferably formed by oxidation of AlAs layers of Ga1-xAlxAs layers, where the Al content is preferably x>0.92, resulting in the formation of AlO or GaAlO dielectric apertures. In an alternative embodiment, the current apertures are formed by proton bombardment.

Laser light comes out (950) through the fourth distributed Bragg reflector (972). Due to the saturable absorber (961), the light comes out in the form of pulses. The modulator (962) allows to vary the refractive index of the medium and thus to change the repetition frequency of the pulses.

In one another embodiment of the present invention, the modulator region operates under a forward bias. This causes the exciton bleaching effect that changes the optical absorption peak and thus affects the refractive index of the modulator. In this case, the modulator may be placed in the same cavity as the active region.

In yet another embodiment of the present invention, the active region, the saturable absorber, and the modulator are placed in three different cavities. However, in all relative embodiments two, or three, or more cavities are coupled, and all three elements, the active region, the saturable absorber, and the modulator interact via a single optical mode.

In one another embodiments, bias is applied independently to active region, saturable absorber, and modulator from three sources.

Another embodiment of the present invention is possible, wherein a surface-emitting tilted cavity laser is used, providing an electrooptically-modulated mode-locked tilted cavity surface-emitting laser.

And yet another embodiment is possible, wherein one or more intracavity contacts are used, and one or more distributed Bragg reflectors are undoped.

And one another embodiment of the present invention may be possible, wherein a laser operates with one or multiple external mirrors.

And yet another embodiment of the present invention includes a laser, at least one mirror of which is a distributed feedback mirror.

In the case of the properly designed electrooptically-active media, application of the voltage to the modulator section will cause a very significant modulation of the refractive index and, as a result of this, a very significant modulation of the refractive index. As the mode locking (ML) frequency is governed by the group velocity of light, which is strongly related to the refractive index, the ML frequency will be tuned in a significant range. The ML frequency may reach 200-400 GHz or higher in case of short devices (~200 µm and less). In vertical cavity devices the frequency may me even higher. Electroabsorption section may also operate at ultrahigh speeds due to the ultrasmall surface area of the section, low differential capacitance under reverse bias, and an inherent nature of electrooptic effect. Thus, ultrahigh-speed tuning of the ML frequency becomes possible. If the receiver section is designed to have a narrow bandwidth response adjusted the chosen ML frequency, the frequency tuning beyond the bandwidth will cause signal reduction and the frequency modulation will be converted to intensity modulation. Different detecting schemes may be applied. In some cases, for example, in frequency tuning of the optical clock system no need in bandwith-selective photodetectors exists.

We should emphasize that the disclosed optoelectronic device may operate in the frequency modulated regime, wherein the repetition frequency of the pulsed laser light $\Omega$ is modulated with some frequency $\omega$, wherein the modulation frequency $\omega$ is significantly smaller than the repetition frequency $\Omega$. Preferably, the repetition frequency is at least five times higher than the modulation frequency $\omega$. Thus, to modulate the signal with the modulation frequency 40 GHz it is preferably to have pulse the repetition frequency, or, in other terms, carrier frequency at least 200 GHz. For higher modulation frequency, say 200 GHz, the pulse repetition frequency should be preferably at least 1 THz.

A typical spectrum of frequency modulated signal can be illustrated by considering an example of a cosine wave with a modulated frequency. Let the optical signal have the form of a cosine wave with a time-dependent phase, $$A(t)=A_0 \cos [\phi(t)] \tag{7}$$

wherein the time-dependent, or modulated frequency is the temporal derivative of the phase, $$\frac{d\varphi}{dt} = \Omega(t) = \Omega_0 + \Delta\Omega\cos(\omega t). \tag{8}$$

Then the time-dependent optical signal (7) can be written as follows, $$A(t) = A_0 \cos\left\{\Omega_0 t + \frac{\Delta\Omega}{\omega}\sin(\omega t)\right\}. \tag{9}$$

Then Eq. (9) can be expanded in a series of different harmonic signals having the frequencies $\Omega_0$, $\Omega_0 \pm \omega$, $\Omega_0 \pm 2\omega$, etc.

$$A(t) = A_0 J_0(\beta) + A_0 \sum_{k=1}^{\infty} J_{2k}(\beta)\{\sin[(\Omega_0 + 2k\omega)t] + \sin[(\Omega_0 - 2k\omega)t]\} + \tag{10}$$

-continued $$A_0 \sum_{k=0}^{\infty} J_{2k+1}(\beta)\{\cos[(\Omega_0 + (2k+1)\omega)t] + \cos[(\Omega_0 - (2k+1)\omega)t]\}$$

where parameter $$\beta = \frac{\Delta\Omega}{\omega},$$

and $J_n(\beta)$ is the Bessel function of the first kind and order n.

In many practical situations, $\beta<<1$, and the amplitudes of the higher harmonics in Eq. (10) decrease rapidly with k.

If the modulated signal is a pulse signal rather than the cosine wave (7), it contains also higher harmonics of the carrier frequency. Thus, the Fourier expansion of the frequency modulated signal contains a set of harmonics $\Omega_0$, $\Omega_0 \pm \omega$, $\Omega_0 \pm 2\omega$, ..., $2\Omega_0$, $2\Omega_0 \pm \omega$, $2\Omega_0 \pm 2\omega$, ..., $3\Omega_0$, $3\Omega_0 \pm \omega$, $3\Omega_0 \pm 2\omega$, etc. Schematically, the spectrum of a frequency-modulated optical signal is given in FIG. 10.

To detect the frequency-modulated signal, a resonant photodetector is preferably used. Dashed-dotted lines show schematically the sensitivity spectral range of the photodetector arranged such that one combined harmonic of the frequency-modulated signal, for a given value of the modulation frequency ω fits the sensitivity range of the photodetector. If the modulation frequency is changed, the frequency of the selected combined harmonics shifts out of the sensitivity spectral range of the photodetector, and no signal is detected by the photodetector. Such approach allows decoding of a frequency-modulated data transmission signal.

This concept can be applied in telecom, datacom, fiber to the home, radio over fiber frequency and signal distribution for wireless networks, optical clocking and frequency tuning optical clocking, optical interconnects, enterprise networks, cryptography, sensing, medicine, and in other applications.

Certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

The invention claimed is:

1. A data transmission optoelectronic device, comprising:
   mirrors providing feedback for light;
   a waveguide disposed between said mirrors;
   an active section incorporated in said waveguide, said active section having an active element for generating an optical gain if a forward bias is applied, said active element being selected from the group consisting of:
   a) a quantum well;
   b) an array of quantum wires;
   c) an array of quantum dots;
   d) a stack of quantum wells, quantum wires, or quantum dots; and
   e) any combination of a) through d);
   an absorption section incorporated in said waveguide; and
   an additional modulator incorporated in said waveguide, said additional modulator being configured to modulate a refractive index thereof such that a repetition frequency of the pulsed laser light is frequency-modulated and frequency-modulated optical data signals are generated;
   wherein the device is operable in a pulsed regime emitting pulsed laser light and the device is adapted to transmit frequency-modulated data signals.

2. The data transmission device according to claim 1, wherein said additional modulator comprises a material that exhibits an electrooptic effect providing a relative change of the refractive index of at least $\Delta n[\%]=1\%$ at an applied electric field 100 keV/cm.

3. The data transmission device according to claim 1, wherein means for providing modulation includes a switch for switching the repetition frequency between at least two different repetition frequencies.

4. The data transmission device according to claim 1, wherein said active section is selected from the group consisting of:
   a) an edge-emitting diode laser;
   b) a vertical cavity surface emitting laser;
   c) a tilted cavity laser operating in the edge-emitting geometry;
   d) a tilted cavity laser operating in the surface-emitting geometry;
   e) a wavelength-stabilized leaky wave laser with reflection from a back side of the substrate;
   f) a distributed feedback laser;
   g) a microdisk laser;
   h) a photonic crystal laser;
   i) a laser comprising at least one external mirror; and
   j) a laser, wherein at least one mirror is a distributed feedback mirror.

5. The data transmission device according to claim 1, wherein said absorption section is monolithic with said gain section and grown in a single epitaxial process.

6. The data transmission device according to claim 1, wherein a common medium is used as a gain medium and an electrooptically active medium.

7. The data transmission device according to claim 1, wherein a medium used as electrooptically active medium is different from a medium used as a gain medium.

8. The data transmission device according to claim 1, wherein said electrooptic modulator and said active element are placed in mutually different cavities.

9. The data transmission device according to claim 1 commonly fabricated with other devices in an array of devices on a common wafer, and the devices of the array are configured operate independently for multi-channel transmission.

10. A method of generating pulsed laser light, the method which comprises:
   providing a data transmission device that is operable in a pulsed regime, the device having an active section and an absorption section, a waveguide incorporating the active section and the absorption section, and mirrors providing feedback for light, with the waveguide disposed between the mirrors;
   providing the active section of the data transmission device with an active element being selected from the group consisting of:
   a) a quantum well;
   b) an array of quantum wires;
   c) an array of quantum dots;

d) a stack of quantum wells, quantum wires, or quantum dots; and e) any combination of a) through d);

applying a forward bias to the active element of the active section; and generating optical gain therein;

transmitting data signals in a frequency-modulated manner;

modulating a refractive index of an additional modulator incorporated in the waveguide of the device such that the repetition frequency of the pulsed laser light is frequency-modulated and frequency-modulated optical data signals are generated.

11. The method according to claim 10, which comprises frequency-modulating the pulsed laser light by switching the repetition frequency between at least two different repetition frequencies.

* * * * *